United States Patent
Dovids et al.

(10) Patent No.: US 10,395,960 B2
(45) Date of Patent: *Aug. 27, 2019

(54) HIGH DENSITY STOCKER WITH INTERLOCKING NUBS

(71) Applicant: MURATA MACHINERY, LTD., Kyoto-shi, Kyoto (JP)

(72) Inventors: Gerhard Dovids, Grabs (CH); Yves Fenner, Berg (CH); John Fiddes, Kreuzlingen (CH); Christian Wohanka, Tägerwilen (CH); Bernd Rahrbach, Constance (DE)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/791,627

(22) Filed: Oct. 24, 2017

(65) Prior Publication Data

US 2018/0122677 A1 May 3, 2018

Related U.S. Application Data

(60) Provisional application No. 62/412,249, filed on Oct. 24, 2016.

(51) Int. Cl.
*H01L 21/677* (2006.01)
*H01L 21/67* (2006.01)
(Continued)

(52) U.S. Cl.
CPC ...... *H01L 21/67778* (2013.01); *B25J 9/1617* (2013.01); *B65G 1/1375* (2013.01); *B65G 37/005* (2013.01); *B65G 37/02* (2013.01); *H01L 21/6776* (2013.01); *H01L 21/67196* (2013.01); *H01L 21/67259* (2013.01); *H01L 21/67265* (2013.01); *H01L 21/67346* (2013.01); *H01L 21/67733* (2013.01); *H01L 21/67736* (2013.01); *H01L 21/67742* (2013.01);
(Continued)

(58) Field of Classification Search
CPC ......... H01L 21/67259; H01L 21/67265; H01L 21/67346; H01L 21/6776
See application file for complete search history.

(56) References Cited

U.S. PATENT DOCUMENTS

2018/0122674 A1* 5/2018 Dovids ............ H01L 21/67386
2018/0122675 A1* 5/2018 Dovids ............ H01L 21/67766

FOREIGN PATENT DOCUMENTS

JP 2009260252 A * 11/2009

* cited by examiner

*Primary Examiner* — Gerald McClain
(74) *Attorney, Agent, or Firm* — Keating & Bennett, LLP

(57) ABSTRACT

A substrate stocker system includes a high-density storage chamber that comprises one or more stacks of one or more substrates in a closed position, one or more low density containers that are configured to store one or more substrates in an open position, one or more opener stations that are configured to receive one or more substrates and includes one or more separator modules for changing one or more distances between corresponding one or more adjacent substrates. The substrate stocker system further includes a first robot configured to move one or more stacks between the high-density storage chamber, and the one or more opener station, and a second robot configured to move the individual one or more substrates between the one or more opener stations and the one or more low density containers.

8 Claims, 24 Drawing Sheets

(51) Int. Cl.
*B25J 9/16* (2006.01)
*B65G 37/02* (2006.01)
*B65G 37/00* (2006.01)
*B65G 1/137* (2006.01)
*H01L 21/673* (2006.01)

(52) U.S. Cl.
CPC .. *H01L 21/67766* (2013.01); *H01L 21/67769* (2013.01); *B65G 2201/0297* (2013.01)

Transferring the substrates between a container and an opener station, wherein the container comprises a first pitch between the substrates
300

Collapsing the substrates in the opener station, wherein the substrates in collapsed state comprise a second pitch smaller than the first pitch
310

Transferring the substrates, in collapse state, in the opener station to a storage chamber
320

*FIG. 3A*

Transferring the substrates between a container and a storage chamber, wherein the container comprises a pitch between the substrates significantly less than that of a SEMI standard
340

Wherein the substrates are transferred without the container
350

Wherein the substrates are transferred together with the container
360

*FIG. 3B*

Transferring a stack of substrates, wherein the substrates comprise a first pitch
800

Separating the stack of substrates so that the substrates comprises a second pitch larger than the first pitch
810

Transferring individual substrates at the second pitch
820

FIG. 8A

Transferring individual substrates to form a stack of substrates, wherein the substrates comprise a first pitch
840

Collapsing the stack of substrates so that the substrates comprises a second pitch smaller than the first pitch
850

Transferring the stack of substrates
860

FIG. 8B

```
┌─────────────────────────────────────────────┐
│ Transferring a stack of the substrates in a │
│ storage chamber to an opener station,       │
│ wherein the stack of substrates comprises   │
│ a first pitch                               │
│ 1000                                        │
└─────────────────────────────────────────────┘
                      │
                      ▼
┌─────────────────────────────────────────────┐
│ Separating the stack of substrates in the   │
│ opener station, wherein the substrates in   │
│ separated state comprise a second pitch     │
│ larger than the first pitch                 │
│ 1010                                        │
└─────────────────────────────────────────────┘
                      │
                      ▼
┌─────────────────────────────────────────────┐
│ Transferring the substrates in the opener   │
│ station to a container                      │
│ 1020                                        │
└─────────────────────────────────────────────┘
```

FIG. 10A

```
┌─────────────────────────────────────────────┐
│ Transferring one or more stacks of          │
│ substrates from a storage chamber to one    │
│ or more opener stations, wherein the one    │
│ or more stacks of substrates comprise a     │
│ pitch between the substrates significantly  │
│ less than that of a SEMI standard           │
│ 1040                                        │
└─────────────────────────────────────────────┘
                      │
                      ▼
┌─────────────────────────────────────────────┐
│ Separating the one or more stacks of        │
│ substrates                                  │
│ 1050                                        │
└─────────────────────────────────────────────┘
                      │
                      ▼
┌─────────────────────────────────────────────┐
│ Transferring individual substrates in the   │
│ one or more stacks of substrates to         │
│ containers in a EFEM                        │
│ 1060                                        │
└─────────────────────────────────────────────┘
```

FIG. 10B

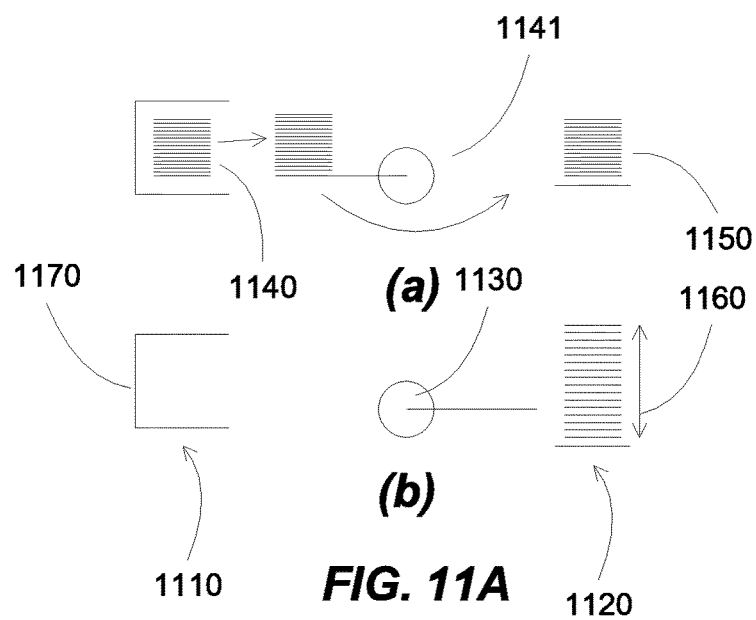
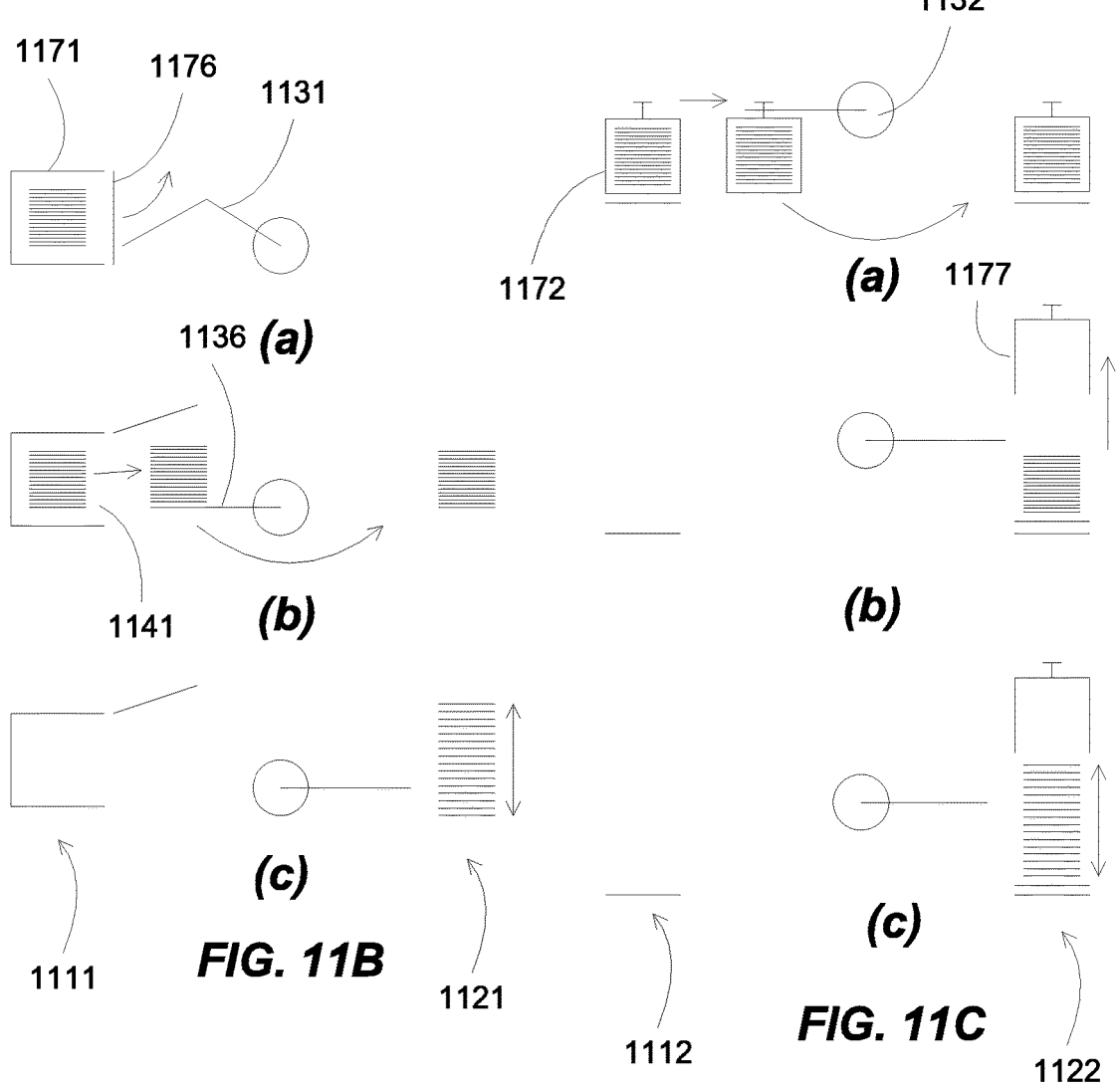
FIG. 11A
FIG. 11B
FIG. 11C

Receiving a stack of substrates from a storage chamber
1200

Transferring the stack to an opener station, wherein the stack comprises a larger pitch at the opener station
1210

FIG. 12A

Open a compartment door in a storage chamber for receiving a stack of substrates
1230

Transferring the stack to an opener station, wherein the stack comprises a larger pitch at the opener station
1240

FIG. 12B

Transferring the container having a stack of substrates to an opener station
1260

Opening the container
1270

Separating the stack of substrates, wherein the stack comprises a larger pitch
1280

FIG. 12C

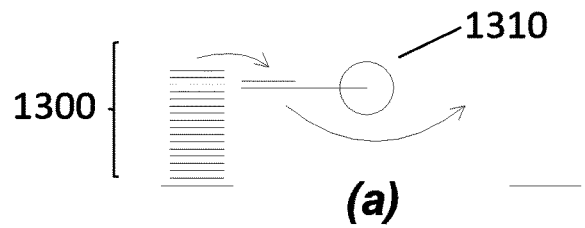
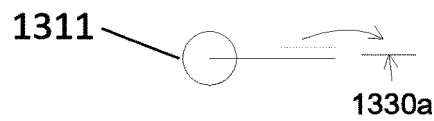
FIG. 13A
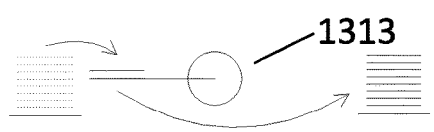
FIG. 13B
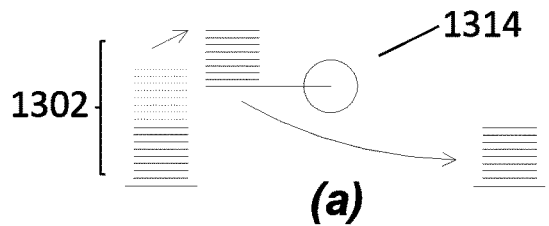
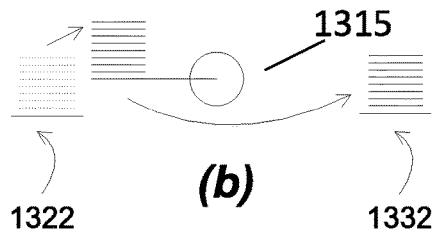
FIG. 13C
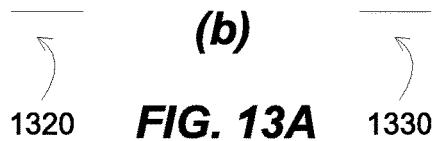
FIG. 13D
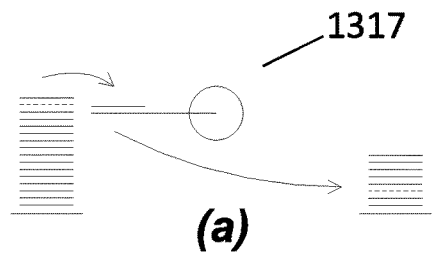
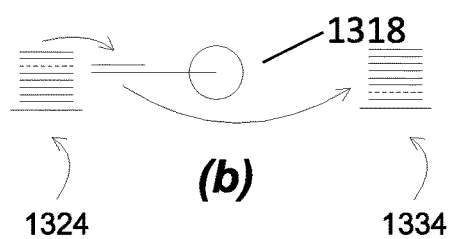
FIG. 13E Transferring substrates from an opener station to one or more stations having similar substrate pitch
1400

FIG. 14A

Simultaneously transferring a portion of a stack of substrates from an opener station to a station having similar substrate pitch
1420

FIG. 14B

Transferring a stack of substrates to an opener station
1440

Increasing a pitch of the stack of substrates
1450

Sorting substrates from the opener station to one or more stations having similar substrate pitch
1460

FIG. 14C

Forming an EFEM comprising a loading station for a low density container and a loading station for a high density container, wherein the EFEM comprises a robot for individual substrate handling at the low density container and a robot for substrate stack handling at the high density container, wherein the EFEM is configured to interface with one or more opener stations
2100

Transferring between the opener stations and the loading stations
2110

Transferring between the loading stations through an opener station
2120

*FIG. 21*

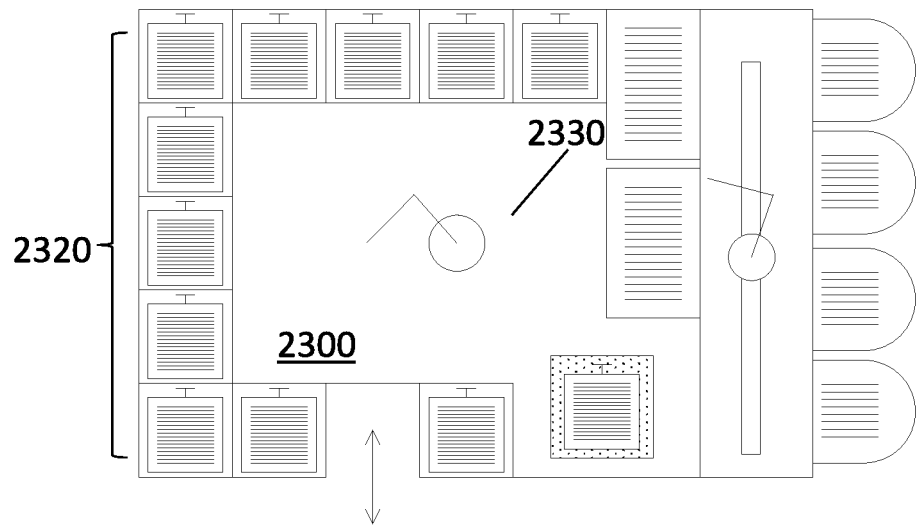
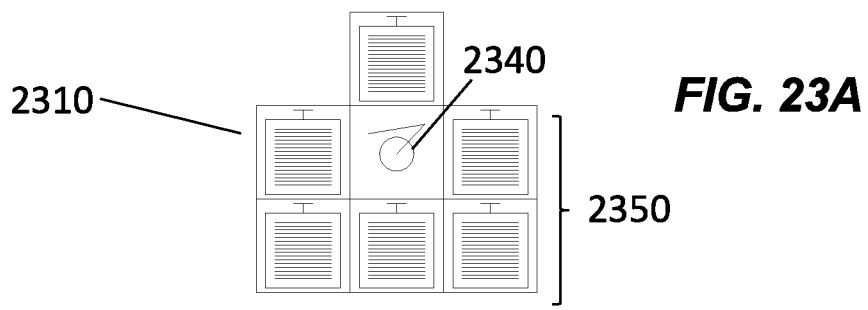
*FIG. 23A*
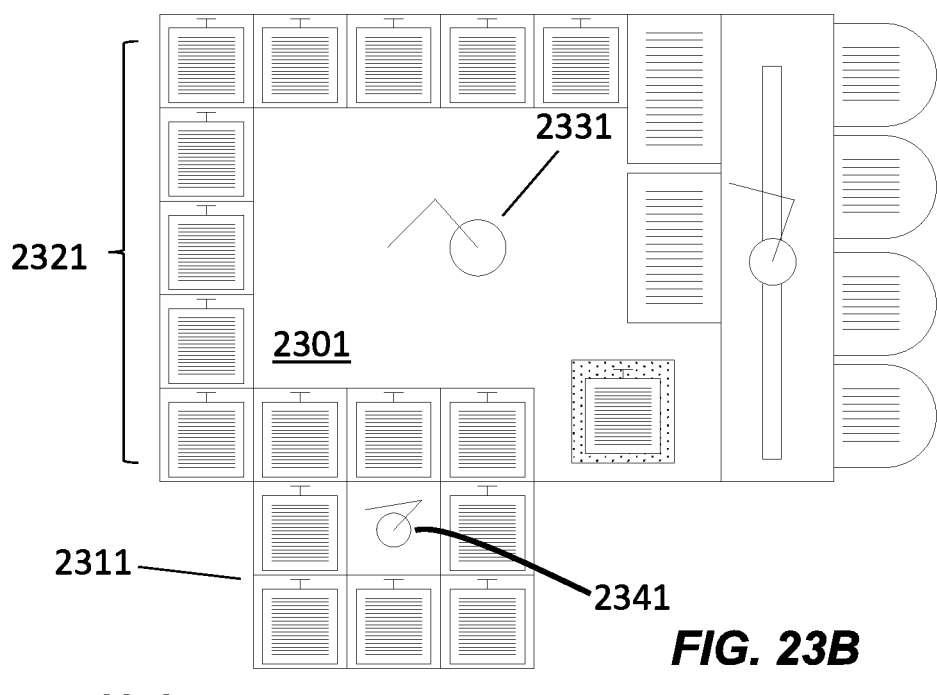
*FIG. 23B*

Forming a storage area with removable storage compartments, wherein the storage area is configured to store substrates at a high density
2400

FIG. 24A

Forming a storage area with a docking station for accepting substrates, wherein the storage area is configured to store substrates at a high density
2420

FIG. 24B

Forming a dock cart for mating with a storage area, wherein the storage area is configured to store substrates at a high density
2440

FIG. 24C

Mating a dock cart to a storage area of a stocker
2460

Transferring substrates from the dock cart to the storage area
2470

FIG. 24D

HIGH DENSITY STOCKER WITH INTERLOCKING NUBS

This application claims priority from at least U.S. Provisional Patent Application 62/412,249, filed on Oct. 24, 2016 and entitled "High Density Stocker" and U.S. Provisional Patent Application 62/355,856, filed on Jun. 28, 2016 and entitled "Substrate Storage and Processing" which application may be incorporated herein by reference in its entirety for all purposes.

FIELD OF TECHNOLOGY

This disclosure relates generally to substrate storage and processing. In one example embodiment, to an improved substrate storage system, method or apparatus. More specifically, to a storage system, apparatus or method which may provide improved efficiency in readily being able to store and provide substrates to a system such as for processing or use.

BACKGROUND

Within many fields, and specifically within substrate manufacturing and related industries, the efficient and proper handling, storage and processing of materials such as substrates is exceedingly important. Since the introduction of the 300-mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

Prior FOUPs generally serve to preserve wafers from the surrounding clean room environment. Yet FOUPs today may be hampered by methods and system designs which may contaminate their contents, chafe wafers, and delay loading and unloading of substrate wafer contents as a result of multifarious construction. In addition, FOUPs may be inherently limited in their design such that bottle necks and other system inefficiencies may hold up processing or other systems. Thus, there is a need for an invention that more efficiently and accurately accomplishes the desired tasks of FOUPs when working within a larger system construct such as an assembly line or processing line, but also provides for high density storage and buffering capabilities, where at any given moment, a FOUP may be called or requested by the line, and as such storage of wafers near processing area is needed.

Issues with prior substrate storage devices may be exacerbated with construction sizes of typical FOUPs, which may be produced in multiple stages of multiple parts, typically holding a maximum of 25 wafer jobs of 300 mm wafer fibs and device heights of upwards of 330 mm. Recalling that high volume shipments may be imperative, the size of these FOUPs hamper scaling efforts and diminish efficiency by requiring the construction of the storage FOUPs in steps and parts, especially if smaller sized containers may be created to contain the same volume of substrate.

Thus, a substrate storage system, which includes improved design and innovations over the Prior Art FOUPs and associated systems and devices is necessary. There is a need for a storage system, method and apparatus which streamlines processes and increases efficiency of creation and ease of replication in the manufacturing process as well as provide a resilient system hierarchy and steps, of which the ability for quick and efficient storage and retrieval as a key part of the method, system or apparatus.

It is therefore an object of this invention to provide a device which may be used for substrate or wafer containment, transportation, storage and holding in semiconductor manufacturing or like processes as well as provide a system, method or apparatus to aide in the movement and resiliency of the ability to move FOUPS, and substrates, wafers and product such as substrates and Tec-Cell Wafers and systems through a high density and efficient storage ability, where FOUP's may be filled on demand.

SUMMARY

Thus, the present invention provides a stocker, with a high density storage, opening mechanism, and an ability to provide in a clean environment a stocker.

In an embodiment, a substrate stocker system is disclosed that includes a high density storage chamber that comprises one or more stacks of one or more substrates in a closed position, each substrate being supported on a respective carrier; one or more low density containers, each low density container being configured to store one or more substrates in an open position; one or more opener stations coupled to the high density storage chamber and the one or more low density containers, each opener station configured to receive one or more substrates from at least one of: the high density storage chamber and the one or more low density containers, each opener station comprising one or more separator modules for changing one or more distances between corresponding one or more adjacent substrates; a first robot configured to move one or more stacks between the high density storage chamber, and the one or more opener stations; and a second robot configured to move the individual one or more substrates between the one or more opener stations and the one or more low density containers.

In another embodiment, a method of storing and transferring substrates in a substrate stocker system is provided. The method includes transferring a stack of one or more substrates from a high density storage chamber to an opener station through a first robot, the transferred stack of one or more substrates being in a closed position; opening the one or more substrates of the transferred stack at the opener station; and transferring the one or more opened individual substrates to at least one of: a low density container, and one or containers of an Equipment Front End Module (EFEM) coupled to the opener station.

The methods and systems disclosed herein may be implemented in any means for achieving various aspects. Other features may be apparent from the accompanying drawings and from the detailed description that follows.

BRIEF DESCRIPTION OF THE DRAWINGS

Example embodiments may be illustrated by way of example and may be not limited to the figures of the accompanying drawings, in which, like references indicate similar elements.

FIG. 3A describes a flow chart for storing substrates, in accordance with an embodiment of the present invention;

FIG. 3B describes a flow chart for storing substrates, in accordance with an embodiment of the present invention;

FIG. 8A describes a flow chart of a method for opening substrates, in accordance with an embodiment of the present invention;

FIG. 8B describes a flow chart of a method for opening substrates, in accordance with an embodiment of the present invention;

FIG. 10A describes a flow chart of a method for transferring substrates, in accordance with an embodiment of the present invention;

FIG. 10B describes a flow chart of a method for transferring substrates, in accordance with an embodiment of the present invention;

FIG. 11A depicts a top component view of Tec-Cell being transferred from stack to opener, in accordance with an embodiment of the present invention;

FIG. 11B depicts a top component view of Tec-Cell being transferred from stack to opener, in accordance with an embodiment of the present invention;

FIG. 11C depicts a top component view of Tec-Cell being transferred from stack to opener, in accordance with an embodiment of the present invention;

FIG. 12A describes a flow chart of a method for transferring substrates, in accordance with an embodiment of the present invention;

FIG. 12B describes a flow chart of a method for transferring substrates, in accordance with an embodiment of the present invention;

FIG. 12C describes a flow chart of a method for transferring substrates, in accordance with an embodiment of the present invention;

FIG. 13A depicts a top component view of transferring of Tec-Cell, in accordance with an embodiment of the present invention;

FIG. 13B depicts a top component view of transferring of Tec-Cell, in accordance with an embodiment of the present invention;

FIG. 13C depicts a top component view of transferring of Tec-Cell, in accordance with an embodiment of the present invention;

FIG. 13D depicts a top component view of transferring of Tec-Cell, in accordance with an embodiment of the present invention;

FIG. 13E depicts a top component view of transferring of Tec-Cell, in accordance with an embodiment of the present invention;

FIG. 14A describes a flow chart of a method for transferring substrates, in accordance with an embodiment of the present invention;

FIG. 14B describes a flow chart of a method for transferring substrates, in accordance with an embodiment of the present invention;

FIG. 14C describes a flow chart of a method for transferring substrates, in accordance with an embodiment of the present invention;

FIG. 21 describes a flow chart of a method for transferring and loading with different containers, in accordance with an embodiment of the present invention;

FIG. 23A depicts a top component view of Tec-Cell transfer with dock cart, in accordance with an embodiment of the present invention;

FIG. 23B depicts a top component view of Tec-Cell transfer with dock cart, in accordance with an embodiment of the present invention;

FIG. 24A describes a flow chart of a method for transferring and loading with dock cart, in accordance with an embodiment of the present invention;

FIG. 24B describes a flow chart of a method for transferring and loading with dock cart, in accordance with an embodiment of the present invention;

FIG. 24C describes a flow chart of a method for transferring and loading with dock cart, in accordance with an embodiment of the present invention; and FIG. 24D describes a flow chart of a method for transferring and loading with dock cart, in accordance with an embodiment of the present invention.

Figure 1A:
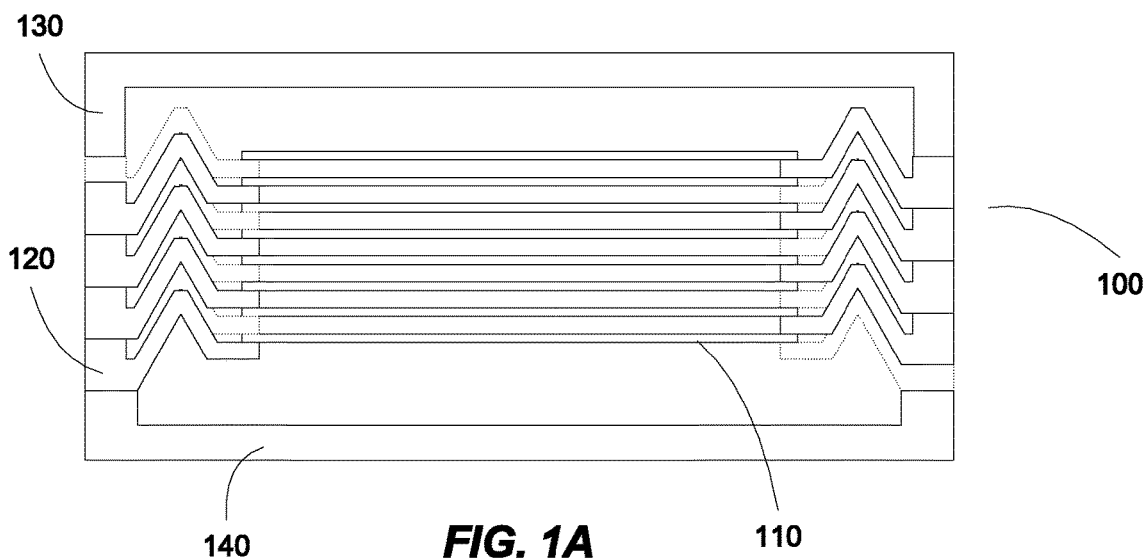
FIG. 1A depicts a side component view of a high density storage or Tec-Cell, in accordance with an embodiment of the present invention.

Other features of the present embodiments will be apparent from the accompanying drawings and from the detailed description that follows.

DETAILED DESCRIPTION OF THE EMBODIMENTS

Disclosed may be methods, apparatus, and systems that may provide a storage system, apparatus or method which may provide improved efficiency in readily being able to store and provide substrates to a system such as for processing or use.

In an embodiment, which may be combined with any other embodiment, the present invention may provide for a substrate storage or stocker including further methods, apparatuses, systems and subsystems, and devices mentioned herein at the least.

In an embodiment, which may be combined with any other embodiment, the present invention described may provide for a stocker or storage system for wafers and other substrates for any purpose such as manufacturing, processing or storage. In a preferred embodiment, the stocker may include a chamber, wherein the substrates are stocked or stored. Within this chamber, may be any number of compartments of which may include at least one wafer, but also may be a stack of wafers. The wafers may be bare in the compartments, or may be held in containers, and preferably each or groups of wafers are supported on substrate carriers.

In an embodiment, which may be combined with any other embodiment, the invention described may provide a container that may include a container body, which surrounds the wafers from at least three sides, container shelves, and a container door at bottom or at side, to access the contents of the container body. Examples of the container include, but are not limited to, a FOUP, a container with an OHT handle for an overhead transport system, and a compartment in a storage chamber or stocker.

In an embodiment, which may be combined with any other embodiment, the invention described may provide that the compartments and containers may be able to be manipulated, moved or opened by robots, or by Overhead Transfer (OHT) systems or by Equipment Front End Module (EFEM) system. It is noted that the robots may be any types of robots, but may include Overhead mounted robots, arm mounted robots, robot with effectors, and conveyors.

In an embodiment, which may be combined with any other embodiment, the invention described may provide that any compartment, chamber, container, etc. may have methods to isolate and seal from contaminants, such as interlocks.

In an embodiment, which may be combined with any other embodiment, the present invention may provide one or more opener stations for separating the stack for accessing substrates, and one or more robots for transferring stack of high density substrates from the containers to the opener stations, and for transferring low density substrates from the opener stations to external containers such as FOUPs. Within the chamber or sub-chamber may be at least one opening station, wherein wafers, stacks of wafers, compartments or containers may be moved by at least one robot, and wherein there is a described ability to separate or open the substrates, such that the substrates or wafers may be removed or placed in the stack. There, then may be an additional robot which may provide wafers, stacks of wafers, or compartments or chambers to the opener station to be opened, and of which may source from containers such as FOUP's.

In an embodiment, which may be combined with any other embodiment, the present invention may provide one or more opener stations that may include actuators with effectors which may then actuate or move, to separate adjacent wafers of the stack. It is noted that the actuation can be by any method as aforementioned. The separation is provided by the actuator and pin, by any method known in the art, while the increase in separation can be caused by separators having pins at a higher separation. It is noted that there may be any other different opener configurations, for example, all wafers are separated at a same distance, the separation distance can be varied, or only some wafers of the stack can be separated.

In an embodiment, which may be combined with any other embodiment, the present invention may provide a separator mechanism in each opener station, the separator mechanism including a conveyor belt, a motor driven cogwheel system supported on the conveyor belt to separate the wafers/substrates of the stack by a predefined pitch. Additionally, the conveyor belt may have nubs or interlocking pieces for supporting the wafers on the belt, and move them to provide separation. It may be apparent to one of ordinary skill in the art that the pitch may be variable, for exposing one or more substrates, and to allow for possible batch transfer, or single substrate transfer, in low as well as high density stacks.

In an embodiment, which may be combined with any other embodiment, the present invention may provide that there may be any plurality of wafer stack, container, chamber, or FOUP, and the at least one robot may move the wafers or stack, individually or by batch, from any number of locations to any number of locations within the stocker system.

In an embodiment, which may be combined with any other embodiment, the present invention may provide for a substrate stocker with a method, in which FOUPs may be loaded to an Equipment Front End Module (EFEM) load station. The EFEM includes a loading station for a low density container and a loading station for a high density container, wherein the EFEM comprises a robot for individual substrate handling at the low density container and a robot for substrate stack handling at the high density container, and wherein the EFEM is configured to interface with one or more opener stations. The EFEM load station may provide for robust, fast and efficient loading capabilities with limited or no contaminant sources. Then, a robot in EFEM may pick up wafers from one or more FOUPs to one or more opener stations. An opener station may then collapse the wafers, to form a dense stack of wafers, to allow a small spacing between wafers, that may be significantly less than that of a SEMI standard. At least one other robot in the stocker may pick up the whole dense stack and place the stack on Tec-cell carriers in a container of a storage. As well as this, the robots may interact with the FOUP's, Tec-Cell carriers, or substrates via any known method. Also in some embodiments, there may be multiple opener stations and any plurality of openers or robots.

In an embodiment, which may be combined with any other embodiment, the present invention may provide that the EFEM may be different for different type of containers and FOUPs, etc. such that the EFEM may match the intended use, or may be actively able to adapt to use with different containers. This is also to be noted to be used as a broader ability than OHT and may supplement, be instead of OHT, among other methods or systems.

In an embodiment, which may be combined with any other embodiment, the present invention may provide for a substrate stocker with a method, in which stacks of high density substrates may be loaded in containers of a storage chamber. Then, a storage robot may pick up one or more stacks from one or more containers, and transfer to one or more opener stations of fixed or adjustable pitches. An opener station may separate a stack of Tec-Cell to allow a large spacing between each wafer, for example, 10 mm. At least one other robot in the stocker may pick up one or more wafers from the opener stations, and place them in one or more external containers such as FOUPs.

In an embodiment, which may be combined with any other embodiment, the present invention may provide a stocker system that comprises an operator loading station and an automatic loading station for transferring containers. The operator loading station is a port/terminal which may be accessible by human manual entry. The operator loading station include a port which may be accessible by a machine transfer mechanism for transferring individual substrates.

In an embodiment, which may be combined with any other embodiment, the present invention may provide for a substrate stocker, wherein the substrate stocker or stocker includes at least one of a dock cart assembly, an alternate stocker, an Integrated Overhead transport (OHT) system in storage, and EFEM for FOUP and Tec-Cell Carriers. In an embodiment, which may be combined with any other embodiment, the present invention may provide for an EFEM for FOUPs and Tec-Cell carriers of which may link the present stocker and other processing stations. This EFEM may accept FOUPs and Tec-cell carriers with the opener as an option.

In an embodiment, which may be combined with any other embodiment, the present invention may provide for a substrate stocker where the EFEM, opener stations and robots, may sort or otherwise provide an operation such as organizing, sorting, grading or otherwise moving or choosing substrates, carriers, or groups by some method, whether it be known placement, such as from identifiers on the individual carriers, substrates or pieces, of which may be physical, wireless, or wired markers and connect to a database, or via inspection of the objects through any method.

In an embodiment, which may be combined with any other embodiment, the present invention may provide for a substrate stocker that may provide for purging at any point of the system, such as to provide for less contamination, and may be used between wafers. There may be individual storage containers, with doors and individual wafer purge, as well as sectional or system based. It is noted the stocker system may include purging at any level of the system, such as system wide, chamber wide, or at each individual compartment, or wafer. In an example, herein, N2/NO gas may be used for purging, and may be configured to reach each container and substrate equally through laminar flow. Various parameters such as purge gas temperature control, purge time/before, during, after closing, recovery times, high flow/low flow may be set for the laminar flow of purge gas.

In an embodiment, which may be combined with any other embodiment, the present invention may provide for a substrate stocker where the individual storage containers may be removed from the stocker. In some embodiments, the storage containers may be placed in a tower, and the tower may be removed from the stocker as a whole such then the tower and internal pieces may then be isolated limiting contamination.

In an embodiment, which may be combined with any other embodiment, the present invention may provide for dock carts that may be used to directly put containers to the stocker system. In an example, the dock carts may move containers and towers between stockers, or internally within the stockers, by enabling the containers to mate with the stocker. The dock cart may be coupled to a storage area of the stocker to remove the compartments, such as with a robot on the dock cart, or via positioning of the dock cart. In addition, the dock cart can switch out compartments or containers, and in any combination, such as adding a single wafer, or wafers to compartments or containers within the chamber. In an example, the compartments, when attached to the storage chamber, may also be removed and moved by a dock cart which may have OHT abilities or robots, such as to change out a compartment.

In an embodiment, which may be combined with any other embodiment, the present invention may provide for a substrate stocker where instead of dock carts, the Tec-Cell carriers or FOUPs may be carried, manually or via other methods directly to storage.

In an embodiment, which may be combined with any other embodiment, the present invention may provide any method, system or apparatus of transfer mechanism for the FOUPs, Tec-Cell carriers or substrates of which may include Zero Footprint solution, such as ceiling, above floor or sub-floor conveyors, robots or arms.

In an embodiment, which may be combined with any other embodiment, the present invention may provide a method to provide for high density storage, of which may include features such as protection by N2/XCDA/NO and other gases in confined environment, stack ability for space constraints and density, modularity, and floor and ceiling mounts and mounting systems including transporters. In addition, the architecture of the system may include at least a storage in Tec-Cell and Transfer module, among other modules and features which allow for not requiring a clean room environment.

In an embodiment, which may be combined with any other embodiment, the present invention may provide Transfer Module which provide for moving wafers from FOUPS to Tec-Cells (Zoom Pods) manually or automatically, and may provide for the ability to have different or adjustable, either manually or automatically, opener design, pitch and ability of which may adapt to multi wafer end effectors. In addition, the stocks and towers may be automatically or manually, of which may align the stocks, and read the alignment well as stacks, both for proper placement, organization, sorting etc. It will be apparent to any person skilled in the art, that sorting of substrates may take place between two opener stations or between an opener station and container, such as a FOUP, stocker, etc.

In an embodiment, which may be combined with any other embodiment, the present invention may provide any new lighter materials such as Nano-tube material in any usage or structures. In some embodiment, the materials used may also include Peak coated material.

In an embodiment, which may be combined with any other embodiment, the present invention may provide a method where in the Tec-Cell stack, individual modules, or individual substrates may include an electronic tracking device that may detect, store, communicate parameters such as humidity, temperature, shock, charge, stack ID of the stacks, and may present information in any method or device wired or wirelessly or optical based, such as via IR, RFID, photo based such as barcode or QR code, wired, or any other method.

In an embodiment, which may be combined with any other embodiment, the present invention may provide an improved Stocker Management system (SSCMS) that may work with a Manufacturing Execution System (MES) and Material Tracking System (MTS) as well as communicate and network with other exterior or internal systems or $3^{rd}$ party proprietary software through local intranet or internet.

In an embodiment, which may be combined with any other embodiment, the present invention may provide ESD wafer optimized ionization and de-ionization for further quality control as well as improved seal and transfer systems and methods, depending on the application and substrates or objects being held. This may be carried out at any point of the storage or transfer, and may also be actively provided either on an individual wafer or on a compartment basis, section basis, such as each Tec-Cell or FOUP, or on a system wide base.

In an embodiment, which may be combined with any other embodiment, the present invention may include an aforementioned Tec-Cell stack "Zoom" module which may provide for increased wafer density for storage. An increase in wafer density increases transportation system throughput of single and multi-wafer delivery, reduces footprint, shortens wait time, and improves efficiency of transfer, production and processing.

In an embodiment, which may be combined with any other embodiment, the present invention may provide a Fab Level and Load/Unload ability in the Tec-Cell/Zoom Modules, of which may include new load ports, ZOOM/FOUP port loader, of which may all be Zoom capable. Additionally, the Tec-Cell/Zoom and associated devices and systems may include ARMS adapter/transport, zoom adapter and any other adapters and abilities, such as a bottom or top plate which may be structured like FOUP bottom/top plate for the adapters.

In an embodiment, which may be combined with any other embodiment, the present invention may provide where the Zoom modules may be powered, non-powered, RF powered, wireless charged as well as incorporate communication between Zoom pods to hasten movement, efficiency and fulfill internal system movements and requests in a clean, safe, and organized fashion. Many of the wireless communication may be done via RFID devices within the system, and of which may be third party or proprietary design.

In a preferred embodiment, the present invention may provide for a method or system, which may be combined with any other embodiment, the present invention may provide the ability of an improved storage and wafer transfer system that may provide maximum utilization and on time delivery of wafers to process tools.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods may be industry terms and may refer to similar alternatives. In addition, the components shown in the figures, their connections, couples, and relationships, and their functions, may be meant to be exemplary only, and may be not meant to limit the embodiments described herein.

FIG. 1A depicts a side component view of a high density storage 100, in accordance with an embodiment of the present invention. The high density storage 100 may include wafers 110, held within the supports 120. The high density storage 100 may be formed of one or more disassociated parts, such as a top plate 130 and a bottom plate 140, which may be removable for accessing the wafers 110 and supports 120. It may be further noted that, even with dissociated top and bottom plates 130 and 140, the wafers and supports 140 may be accessible from any side in some embodiments.

Figure 1B:
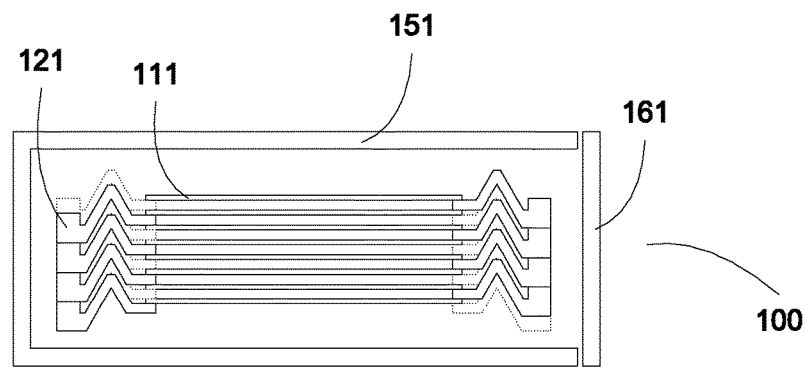
FIG. 1B depicts a side component view of a high density storage or Tec-Cell, in accordance with an embodiment of the present invention.

FIG. 1B depicts a side component view of a high density storage 100, in accordance with an embodiment of the present invention. The high density storage 100 may include wafers 111, held within wafer supports 121. In this example embodiment, the high density storage 100 is a container that is formed of a container body 151, which surrounds the wafers 111 from at least three sides, and a container door 161 on a right side, that may be opened to access the contents of the container body 151. It is noted that in a preferred embodiment, the container door 161 may be on any side.

Figure 1C:
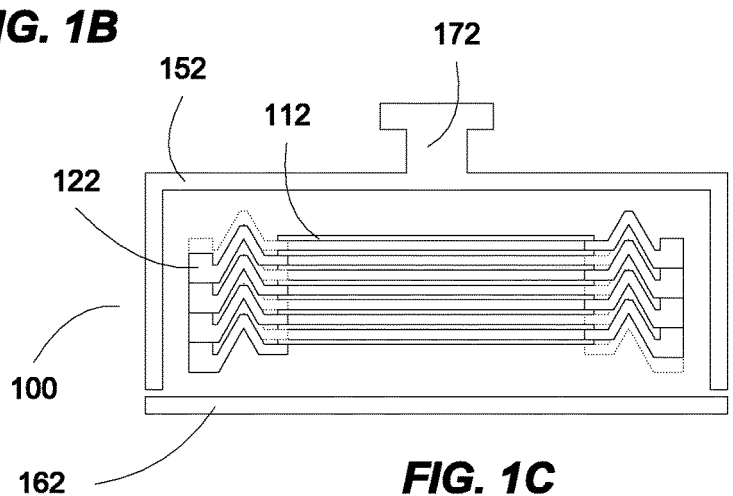
FIG. 1C depicts a side component view of a high density storage or Tec-Cell, in accordance with an embodiment of the present invention.

FIG. 1C depicts a side component view of a high density storage 100, in accordance with an embodiment of the present invention. The high density storage 100 may include wafers 112, held in wafer supports 122. In this example embodiment, the high density storage 100 is a container that is formed of a container body 152, which surrounds the wafer from at least three sides, and a container door 162 on a bottom side that may be opened to access the contents of the container body 152.

Figure 2A:
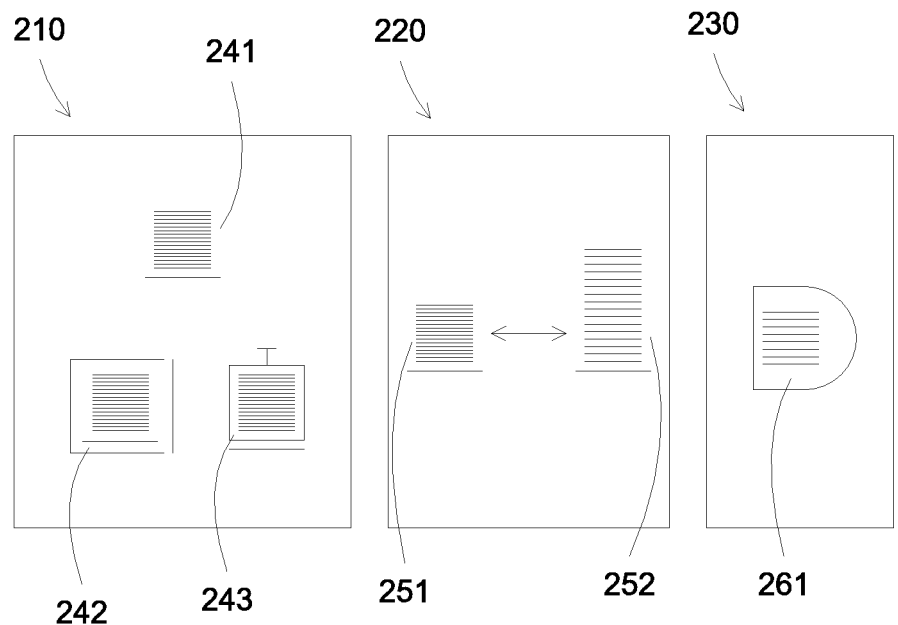
FIG. 2A depicts a side component view of stocker systems, in accordance with an embodiment of the present invention.

FIG. 2A depicts a side component view of a Tec-Cell stocker, in accordance with an embodiment of the present invention. The Tec-Cell stocker is a stocker system that has a high density storage chamber with a conventional loader station or a high density loader station, wherein the loading may be provided in a transport station.

The Tec-Cell stocker includes a storage chamber 210 that stores one or more Tec-Cells or FOUPS such as a first stack 241 of substrates, a second stack 242 of substrates in a container with a side door and a third stack 243 of substrates in a container with a bottom door or an Overhead Transfer Vehicle (OHT).

An adjacent chamber 220 is an opener station that depicts a stack 251 in a collapsed configuration and a second stack 252 in an open configuration. It may be noted that the open configuration allows for easy access of substrates, and the collapsed configuration optimizes storage space constraints.

In an embodiment, the stacks in the open configuration may be transferred to a third chamber 230 from the second chamber 220. The third chamber 230 depicts a loader station for a conventional FOUP 261 in an open configuration.

Figure 2B:
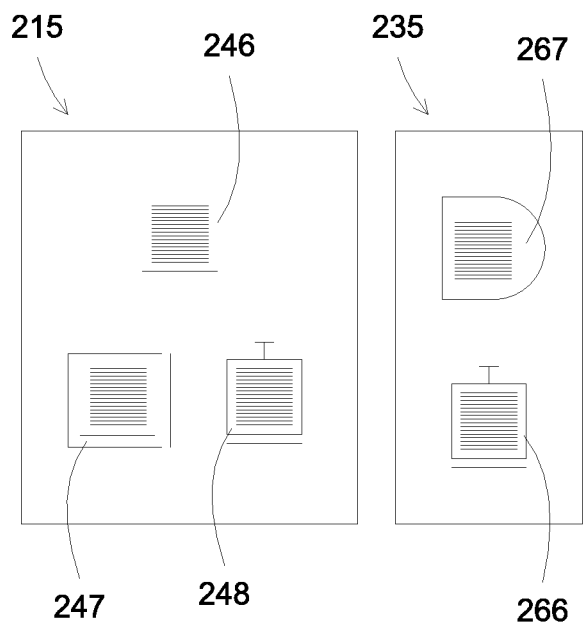
FIG. 2B depicts a side component view of a Tec-Cell stocker, in accordance with an embodiment of the present invention.

FIG. 2B depicts a side component view of a Tec-Cell stocker, in accordance with another embodiment of the present invention. The Tec-Cell stocker has a high density storage chamber 215 with a conventional loader station or a high density loader station. The storage chamber 215 may include a first stack 246 of substrates, a second stack 247 of substrates in a container with a door and a third stack in a container with an OHT 248. The Tec-cell stocker further includes a second chamber 235 that stores a FOUP 267, and a stack with the OHT 266. The storage chamber 235 thus, includes high density containers in collapsed configuration.

FIG. 3A describes a flow chart of an embodiment method for storing substrates in a stocker system such as a Tec-Cell stocker. Step 300 describes transferring the substrates between a container and an opener station of the stocker system. The container generally refers to a movable compartment that stores a stack of substrates, and the opener station is a compartment where opening of collapsed substrates take place. Generally, in a stack, each substrate may be separated from an immediately adjacent substrate by respective gaps. The magnitude of these gaps is referred to as the 'pitch'.

In an embodiment, a substrate stack of the container may have a first pitch. In one embodiment, the pitch of the opener station may be similar to the first pitch or may be different from the first pitch, to suit for different structures and designs, to match a particular object such as a wafer, and to couple to a robot of any type.

Step 310 describes collapsing the substrates of the substrate stack in the opener station, wherein the substrates in the collapsed state has a second pitch smaller than the first pitch. Step 320 describes transferring the substrates in the collapsed state, from the opener station to a storage chamber of the stocker system.

It would be apparent to one of ordinary skill in the art that the steps 300-310 may be performed in any order, and in fact they can be performed in a reverse order to bring substrates from the storage chamber to a loader station.

Additionally, it would be apparent to one of ordinary skill in the art, that there may be a number of intermediary steps between the afore-mentioned steps 300-310, as well as some additional steps. Examples of the intermediary and additional steps include, but are not limited to, transferring supports with substrates, transferring a whole stack of substrates at once, placing stack in a container, opening door for containers, etc.

FIG. 3B describes a flow chart of an embodiment method for storing substrates in a stocker system such as a Tec-Cell stocker.

Step 340 describes transferring the substrates from a container to a storage chamber, wherein a pitch of the substrates of the container is significantly less than that of a SEMI standard. Step 350 describes transferring the substrates to the storage chamber without the container and step 360 describes transferring the substrates to the storage chamber, together with the container.

It is noted though that an embodiment may use generic FOUP's and Tec-Cells with standard pitches, and any other type of container. Additionally, an embodiment may use different types of containers simultaneously, or for different purposes such as for example stockers using two types of loader stations, such as FOUP for operator and high density container for OHT.

Figure 4A:
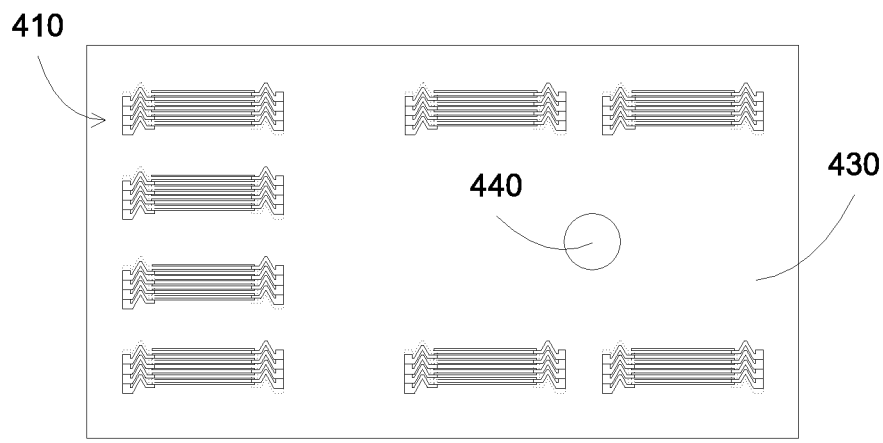
FIG. 4A depicts a component view of Tec-Cell stockers, in accordance with an embodiment of the present invention.

FIG. 4A depicts a component view of a Tec-Cell stocker system, in an embodiment of the present invention. The Tec-Cell stocker includes a storage chamber 430 that includes one or more stacks 410 of wafers either supported on carriers such as Tec-cell carriers or stored in FOUPs. The storage chamber 430 further includes a robot 440 which may be configured to move one or more wafers, or one or more stacks as whole from one position to another in the storage chamber 430. In an embodiment of the present invention, each stack 410, in general has the ability to provide purge gas.

Figure 4B:
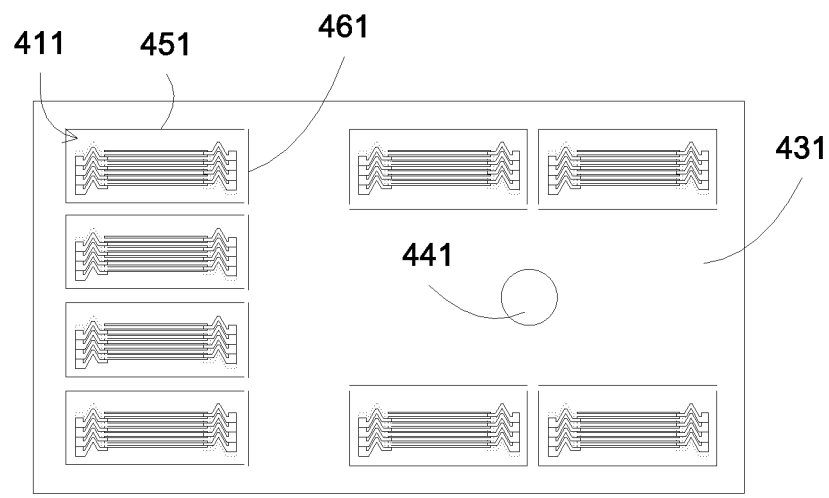
FIG. 4B depicts a component view of Tec-Cell stockers, in accordance with an embodiment of the present invention.

FIG. 4B depicts a component view of a Tec-cell stocker in accordance with another embodiment of the present invention. The Tec-cell stocker includes a storage chamber 431 which includes one or more movable containers 411, each with a container body 451 and a container door 461. Each movable container 411 may store stacks of wafers, Tec-cells or FOUPs. In an embodiment, the one or more containers 411 may be removed from the storage chamber 431 through a robot 441. In an embodiment, the robot 441 may either move a whole container 411 or individual contents/substrates of the container 411 from one location to another. The robot 441 may have an arm to open a container door (look ahead to open door before it reaches containers) and a sensor to open door when the robot 441 approaches the door. In another embodiment of the present invention, each container 411, in general has the ability to provide purge gas for preventing contamination in the storage chamber 431.

Figure 4C:
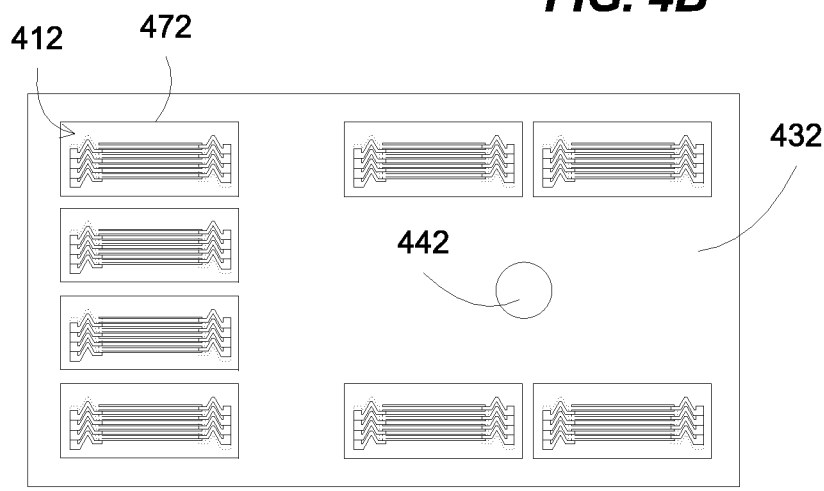
FIG. 4C depicts a component view of Tec-Cell stockers, in accordance with an embodiment of the present invention.

FIG. 4C depicts a component view of a Tec-Cell stocker in accordance with an embodiment of the present invention. The Tec-Cell stocker includes a storage or stocker chamber 432, which may include a one or more stacks of Tec-cells or wafers 412 within one or more containers 472. In an embodiment, the containers 472 may have shelves, or side doors or bottom doors (like FOUP). The storage chamber 432 may include a robot 442 to move a whole container 472 or individual contents/substrates of the container 472 from one location to another. In another embodiment of the present invention, each container 412, in general has the ability to provide purge gas for preventing contamination in the storage chamber 432.

Figure 5A:
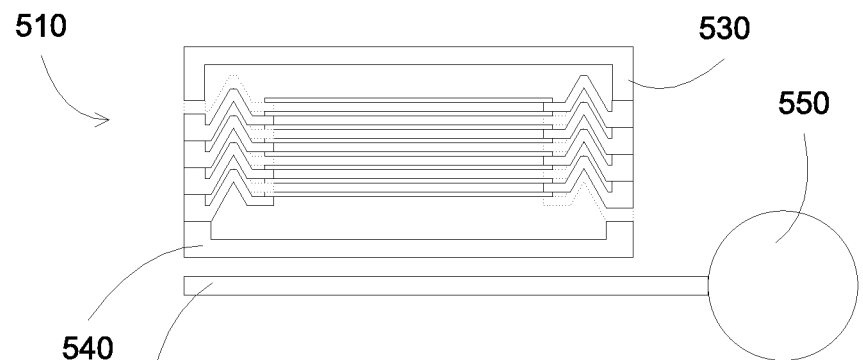
FIG. 5A depicts a side component view of a Tec-Cell, in accordance with an embodiment of the present invention.

FIG. 5A depicts a side component view of a Tec-Cell, in accordance with an embodiment of the present invention. FIG. 5A describers a stack of Tec-Cells 510 and a robot 550 with an end effector 560 to handle stack of Tec-Cells. It is noted that the stack can have removable bottom and top plates 530 and 540, and the robot can support the bottom plate, or any other of the sides in different embodiments.

Figure 5B:
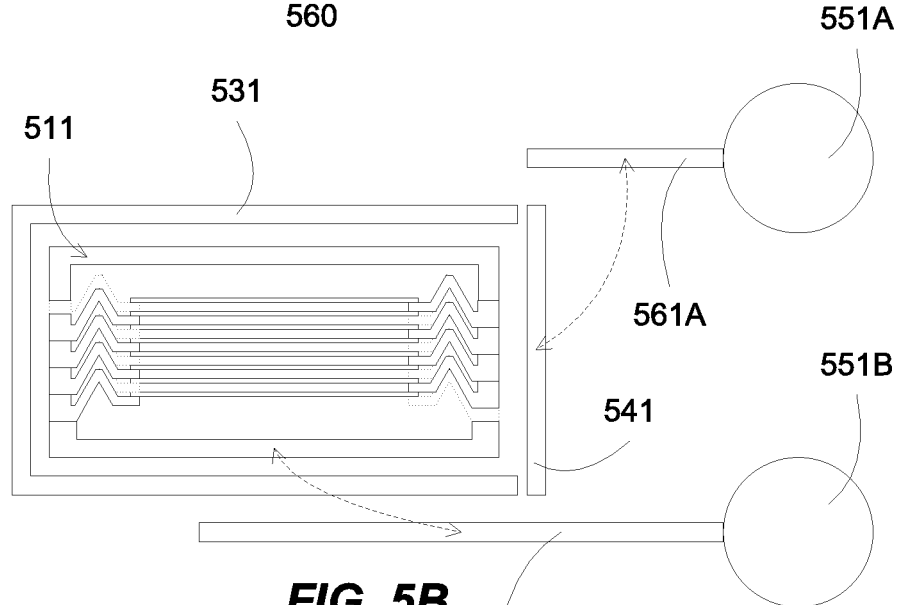
FIG. 5B depicts a side component view of a Tec-Cell, in accordance with an embodiment of the present invention.

FIG. 5B depicts a side component view of a Tec-Cell, in accordance with an embodiment of the present invention. FIG. 5B describes a stack of Tec-Cells 511 stored in a compartment or a container body 531 with doors 541. Also, a robot 551A with an effector 561A and a robot 551B with an effector 561B may be able to open the door 541.

Figure 5C:
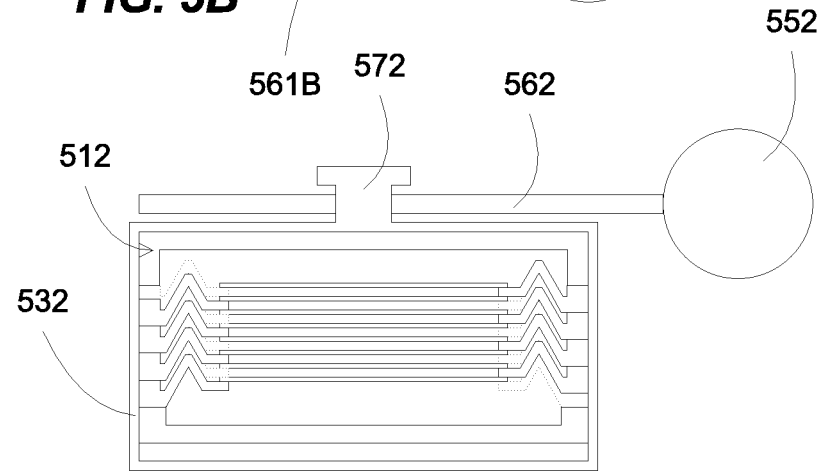
FIG. 5C depicts a side component view of a Tec-Cell, in accordance with an embodiment of the present invention.

FIG. 5C depicts a side component view of a Tec-Cell, in accordance with an embodiment of the present invention. FIG. 5C describes a stack 512 of Tec-Cells stored in a container 532 consisting of an OHT handle 572. Further, a robot 552 with an effector 562 may handle the container 532 and stack via the OHT. It is noted that any mechanism may handle the stack 512 and the container 532 using the effector 562 and OHT handle 572.

Figure 6A:
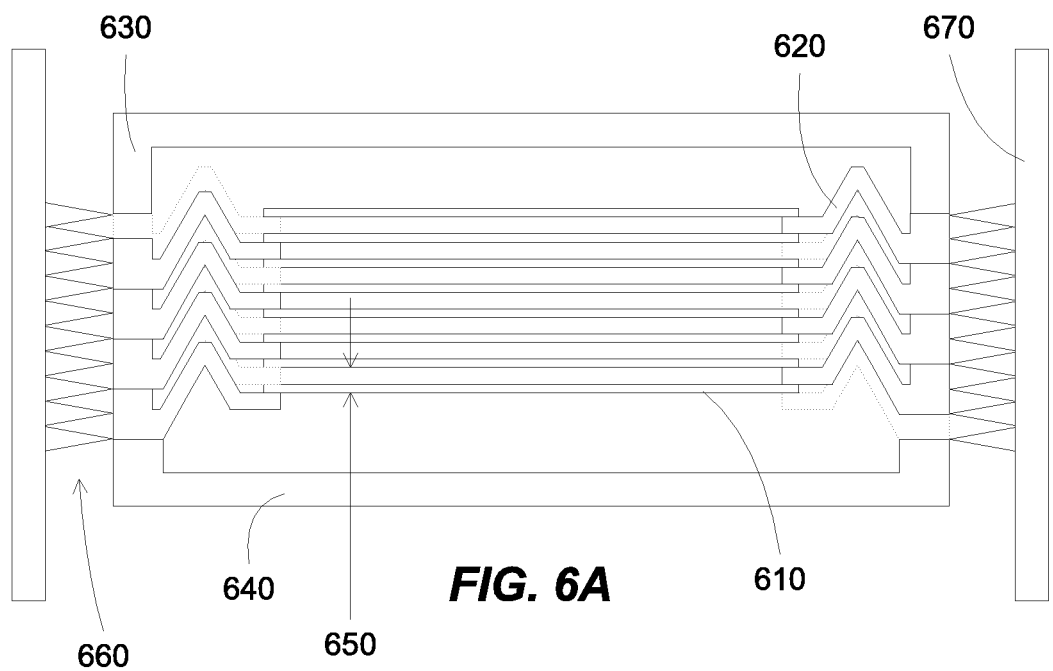
FIG. 6A depicts a side component view of a Tec-Cell opener station, in accordance with an embodiment of the present invention.

FIG. 6A depicts a side component view of a Tec-Cell opener station, in accordance with an embodiment of the present invention. FIG. 6A describes the opener station in closed position with a top end 630 and a bottom end 640 and in-between the ends, it may include wafers 610, held on arms 620. Further, actuators 670 with effectors 660 may then actuate or move, to change the distance between the wafers, as represented by arrows 650. It is noted that the actuation can be by any method as aforementioned.

Apparently, it may be noted that the separation 650 of the wafers is minimal (order of 1-5 mm), for example, in closed position, by separators or actuators 670 having pins or effectors 660 at the same separation.

Figure 6B:
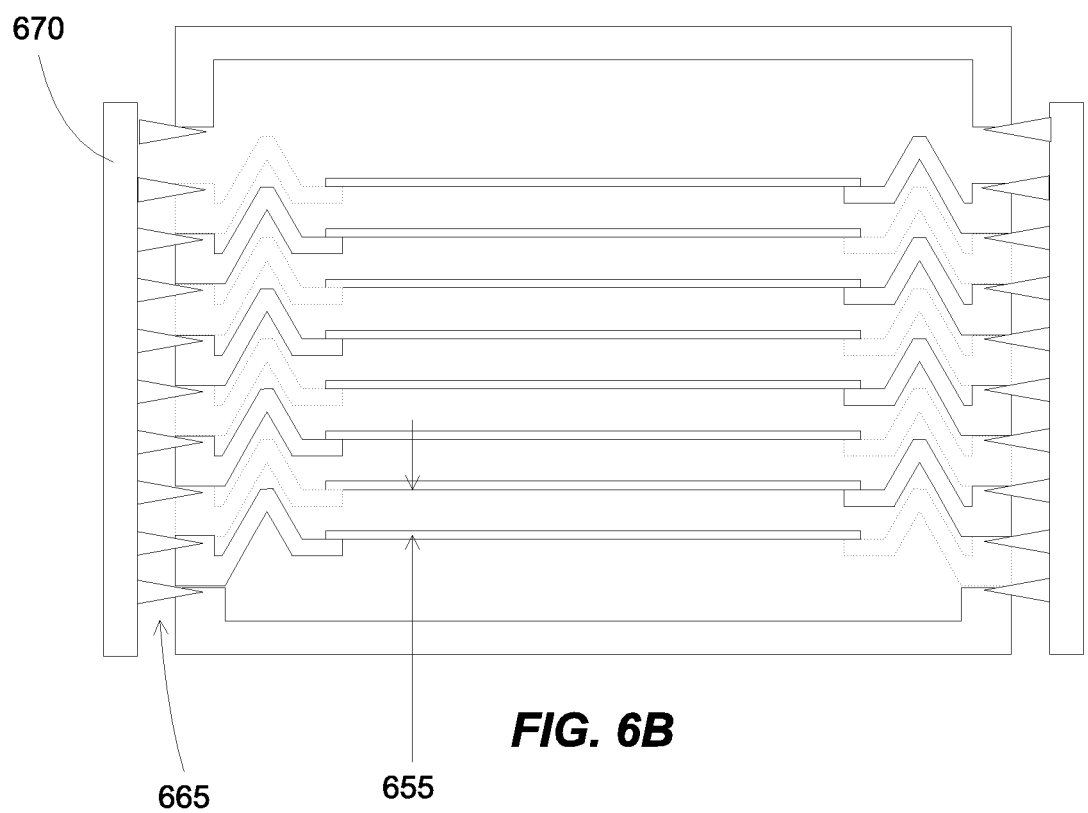
FIG. 6B depicts a side component view of a Tec-Cell opener station, in accordance with an embodiment of the present invention.

FIG. 6B depicts a side component view of a Tec-Cell opener station, in accordance with an embodiment of the present invention. FIG. 6B represents the opener station in an open position with the wafers being separated. The separation 655 has been provided by the actuator and pin, by any method known in the art, while the increase in separation can be caused by separators 670 having pins at the higher separation 665.

Figure 7A:
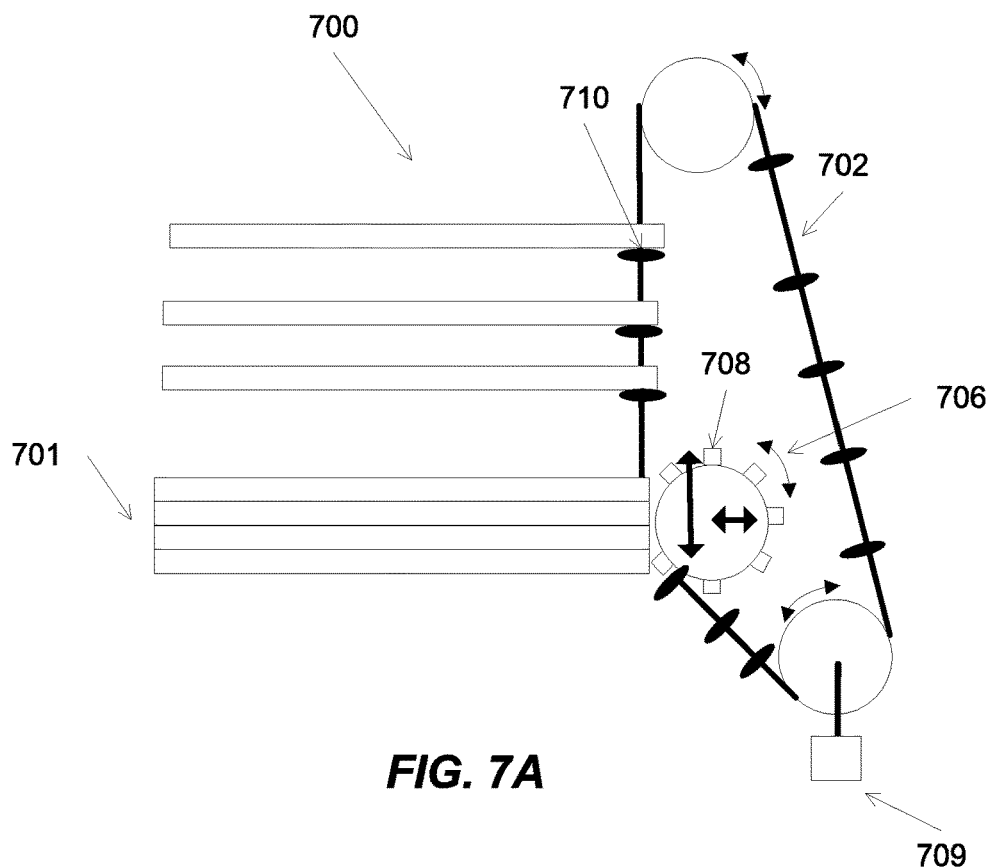
FIG. 7A depicts a side view of Tec-Cell separator mechanism, in accordance with an embodiment of the present invention.

FIG. 7A depicts a side view of a Tec-Cell separator mechanism 700 for a Tec-cell stack 701, in accordance with an embodiment of the present invention. The wafers of the Tec-Cell stack 701 might be at different positions. Some wafers may be separated, while some wafers may be collapsed. The mechanism may include a wire or a belt 702 with a motor driven cogwheel 708 for separating the wafers of the stack 701 by a fixed pitch 706. It is also noted there may be a tensioner 709 such as a spring or hydraulic tensioner, of which may be automatic or manual of which may tension the belt or wire by a pulley or other mechanism.

Figure 7B:
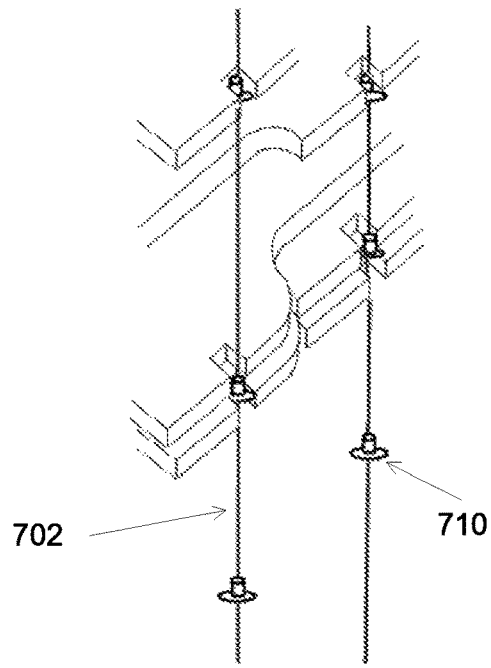
FIG. 7B depicts a side view of Tec-Cell separator mechanism, in accordance with an embodiment of the present invention.

FIG. 7B depicts a side view of Tec-Cell separator mechanism, in accordance with an embodiment of the present invention. Additionally, the wire 702 may have nubs or interlocking pieces 710 for supporting the wafers of the Tec-Cells 701 on the wire 702, and move them to provide separation. The system may provide the nubs or interlocks 710 to be able to remove or add wafers or Tec-Cells 700 to the stack, without having to provide any other interlocks or mechanism such that they may be moved or separated later.

FIG. 8A describes a flow chart of an embodiment method for opening substrates in an opener station of a stocker system such as Tec-Cell stocker system. Wherein as described in an embodiment, step 800 includes transferring a stack of substrates to an opener station from, for example, a storage chamber, wherein the stack of substrates comprise a first pitch. Step 810 includes separating/opening the stack of substrates by increasing the gap between the adjacent substrates, so that the stack of separated substrates comprise a second pitch larger than the first pitch. Step 820 includes transferring individual substrates at the second pitch from the opener station to a low density loading station.

FIG. 8B describes a flow chart of an embodiment method for closing substrates in a Tec-Cell stocker system. Step 840 includes transferring individual substrates to form a stack of substrates, wherein the stack of substrates comprises a first pitch. Step 850 includes collapsing/closing the stack of substrates by decreasing gap between adjacent substrates, so that the stack of collapsed substrates has a second pitch smaller than the first pitch. Finally, step 860 includes transferring the stack of collapsed/closed substrates.

Figure 9A:
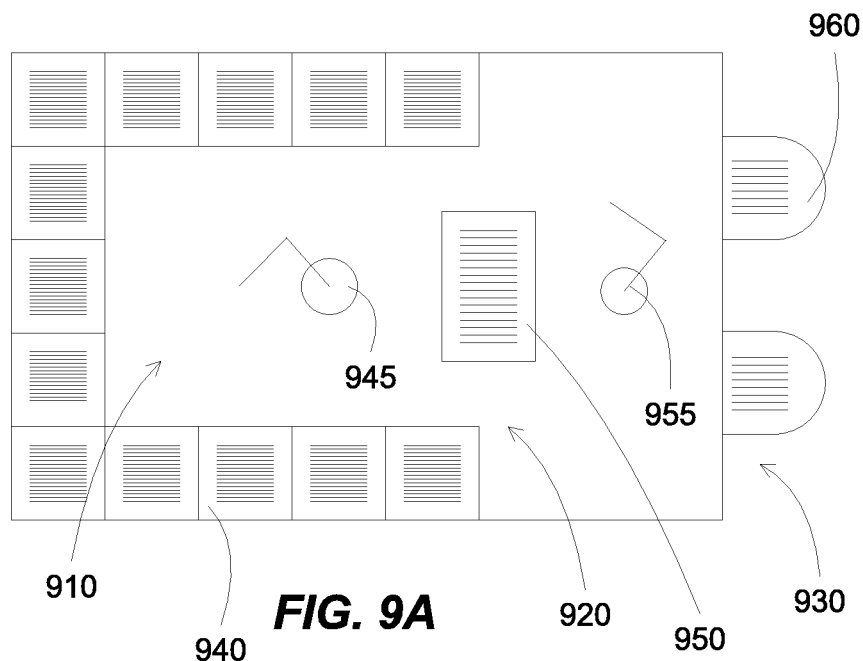
FIG. 9A depicts a top component view of a Tec-Cell stocker, in accordance with an embodiment of the present invention.

FIG. 9A depicts a top component view of a Tec-Cell stocker system, in an embodiment of the present invention. The Tec-Cell stocker system includes a storage chamber 910 that includes one or more high density containers 940, each with a door for storing a stack of collapsed/closed substrates, a first robot 945 to move a stack from a container 940 to an opener station 920 for generating an opened stack 950 of substrates. In the open state, the individual substrates/wafers of the stack 950 may be moved by a second robot 955 from the opener 950 to other containers 960 such as FOUPs with a load port 930.

Figure 9B:
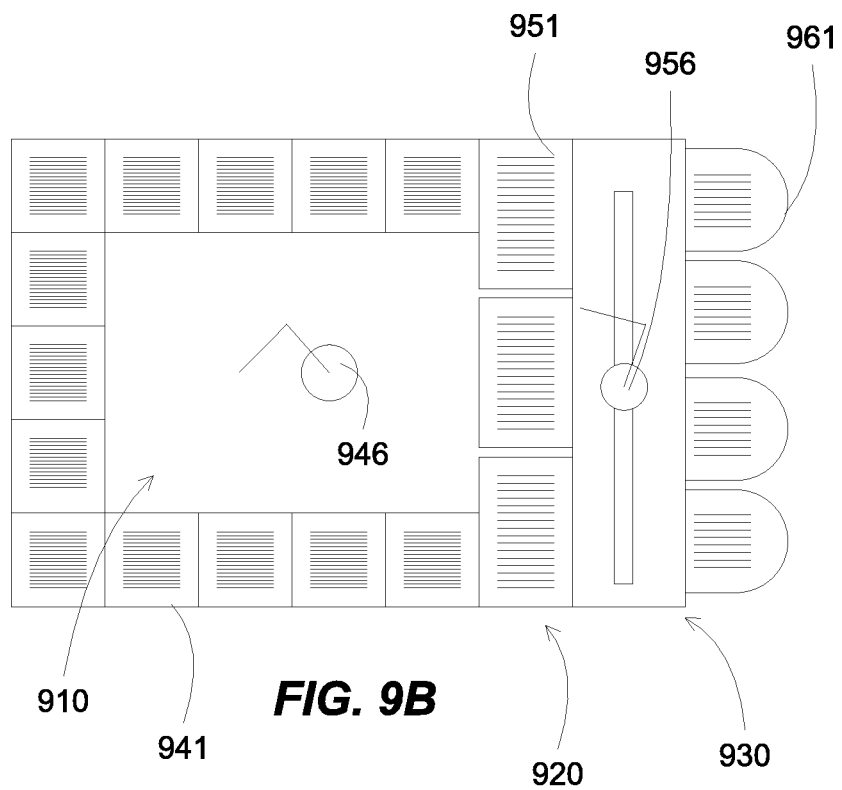
FIG. 9B depicts a top component view of a Tec-Cell stocker, in accordance with an embodiment of the present invention.

FIG. 9B depicts a top component view of a Tec-Cell stocker in an embodiment of the present invention. The Tec-Cell stocker includes a storage chamber 910 that includes, one or more containers 941 with door, at least one robot 946 to move at least one stack from the containers 941 to at least one of multiple opener stations 920, and at least one Equipment Front End Module (EFEM) coupled to the load port 930 includes an EFEM robot 956 to move one or more opened wafers 951 from the one or more opener stations 920 to one more other containers 961 such as FOUPs.

FIG. 10A describes a flow chart of an embodiment method for transferring individual substrates in a Tec-Cell stocker system. Step 1000 includes transferring a stack of the collapsed/closed substrates from a storage chamber to an opener station, wherein the stack of closed substrates comprises a first pitch. Step 1010 includes separating/opening the stack of substrates in the opener station by increasing the gap between corresponding adjacent substrates, such that the substrates in the separated state have a second pitch larger than the first pitch. Process 1020 describes transferring the separated substrates from the opener station to a container such as FOUP.

FIG. 10B describes a flow chart of an embodiment method for transferring individual substrates in a Tec-cell Stocker system. Step 1040 describes transferring one or more stacks of closed substrates from a storage chamber to one or more opener stations, wherein the one or more stacks of closed substrates has a pitch that is significantly less than that of a SEMI standard. Step 1050 describes separating the substrates of the one or more stacks by increasing gaps between corresponding adjacent substrates. Step 1060 describes transferring individual substrates of the one or more stacks to containers such as FOUP through an EFEM robot.

FIG. 11A depicts a component view of transfer of a stack of substrates in a Tec-Cell stocker, in an embodiment of the present invention. FIG. 11A (a) describes a transfer of the stack of substrates from a container 1140 to an opener station 1150 through a robot 1141, wherein, at the opener station 1150, the substrates are in a closed state. FIG. 11A (b) shows then an empty container 1110 with a side door 1170, wherein a robot 1130 had transferred the stack to opener station 1120, that includes a stack of substrates separated by a distance or separation 1160.

FIG. 11B depicts a top component view of transfer of a stack of substrates in a Tec-Cell stocker, in an embodiment of the present invention. Wherein, FIG. 11B (a) shows a container 1171 with a door 1176 that may be opened by a robot 1131 with an effector. FIG. 11B(b) shows then the stack 1141 of closed substrates, being removed from the container 1171 by the robot with effector 1136, for transfer to an opener station, and then FIG. 11B (c) displays an empty container 1111 and a stack 1121 in an open state.

FIG. 11C depicts a top component view of transfer of a stack of substrates in a Tec-Cell stocker, in an embodiment of the present invention. Wherein, FIG. 11C (a) shows a container with an OHT 1172, whose contents are being transferred by a robot 1132 to an opener station (not shown). FIG. 11C (b) shows then the overhead compartment walls 1177 being removed via any method such that the stack is bare at the opener station. FIG. 11C (c) then displays the stack 1122 containing substrates in an open and separated state.

FIG. 12A describes a flow chart of an embodiment method for transferring substrates in a Tec-cell stocker system. Step 1200 describes receiving a stack of closed substrates from a storage chamber. Step 1210 describes transferring the received stack to an opener station for generating a stack of separated substrates with a larger pitch.

FIG. 12B describes a flow chart of an embodiment method for transferring substrates in a Tec-cell stocker system. Step 1230 describes opening a compartment door in a storage chamber, for receiving a stack of closed substrates. Step 1240 describes transferring the stack of closed substrates to an opener station for generating a stack of open substrates that has a larger pitch as compared to that of the stack of open substrates.

FIG. 12C describes a flow chart of an embodiment method for transferring substrates. Step 1260 describes transferring the container having a stack of closed substrates to an opener station. In an embodiment, the container may be provided with an OHT. Step 1270 describes opening the container and the process 1280 describes separating/opening the stack of closed substrates, wherein the stack of separated substrates may comprise a larger pitch as compared to that of the stack of the closed substrates.

FIG. 13A depicts a top component view of transferring of Tec-Cell, in accordance with an embodiment of the present invention. FIG. 13A(a) describes a robot 1310 taking a single wafer from one stack, compartment, or stocker 1300 and moving it to a destination. FIG. 13A(b) describes wafer stack, container, chamber, or FOUP 1320 having a robot 1311, with robot 1311 being able to move the wafers to a wafer stack, container, chamber, or FOUP 1330 or 1330a.

FIG. 13B depicts a top component view of transferring of Tec-Cell, in accordance with an embodiment of the present invention. FIG. 13B(a) describes a robot 1312 taking a single wafer of a larger batch from one wafer stack, container, chamber, or FOUP 1301 to another. FIG. 13B(b) describes taking a single wafer from batch 1321 and moving it into a batch 1331 by a robot 1313.

FIG. 13C depicts a top component view of transferring of Tec-Cell, in accordance with an embodiment of the present invention. FIG. 13C(a) describes a robot 1314 taking a batch subset of a larger batch from one wafer stack, container, chamber, or FOUP 1302 to another. FIG. 13C(b) describes taking a whole wafer stack, container, chamber, or FOUP 1322 and moving it into a batch 1332 by a robot 1315.

FIG. 13D depicts a top component view of transferring of Tec-Cell, in accordance with an embodiment of the present invention. FIG. 13D describes a robot 1316 taking a single wafer of a larger batch from one wafer stack, container, chamber, or FOUP 1323 to another, wherein the wafer may be taken from a particular spot in the stack 1323, or the wafer is chosen particularly, and moved to a particular spot in the destination stack 1333. It is noted this also may be done with any number of wafers or batches at once.

FIG. 13E depicts a top component view of transferring of Tec-Cell, in accordance with an embodiment of the present invention. FIG. 13E(a) describes a wafer being taken from one stack by a robot 1317 to another stack, wherein the wafer is sorted or placed in a particular location. FIG. 13E(b) describes a robot 1318 taking a single wafer of a larger batch from one wafer stack, container, chamber, or FOUP 1324 to another, wherein the wafer may be taken from a particular spot in the stack 1324, or the wafer is chosen particularly, and moved to a particular spot in the destination stack 1334 wherein the sorting and movement may be one to one or one to two, or any other plurality. It is noted this also may be done with any number of wafers or batches at once.

FIG. 14A describes a flow chart of a method for transferring substrates, in accordance with an embodiment of the present invention. Step 1400 describes transferring substrates from an opener station to one or more stations having similar substrate pitch or may have adjustable pitches in some embodiments.

FIG. 14B describes a flow chart of a method for transferring substrates, in accordance with an embodiment of the present invention. Step 1420 describes simultaneous transfer of a portion of a stack of substrates from an opener station to a station having similar substrate pitch.

FIG. 14C describes a flow chart of a method for transferring substrates, in accordance with an embodiment of the present invention. Step 1440 describes transferring a stack of substrates to an opener station. Step 1450 describes increasing a pitch of the stack of substrates and Step 1460 describes sorting substrates from the opener station to one or more stations having similar substrate pitch.

Figure 15A:
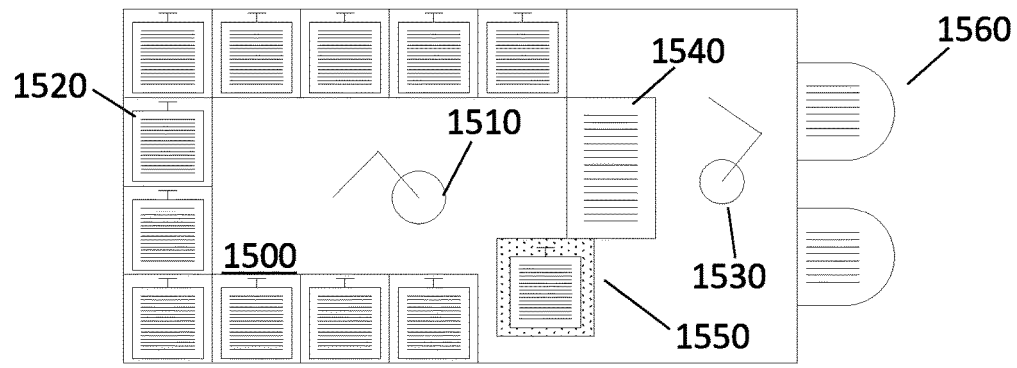
FIG. 15A depicts a top component view of a Tec-Cell stocker, in accordance with an embodiment of the present invention.

FIG. 15A depicts a top component view of a Tec-Cell stocker, in accordance with an embodiment of the present invention. Herein, a stocker system is described that includes a storage chamber 1500 which includes one or more standalone or movable containers 1520 with OHT system. In an embodiment, the stocker may include one or more robots 1510 and 1530 for moving the containers and wafers within the chamber 1500, an opener station 1540, and one or more exterior containers such as FOUPs 1560.

Figure 15B:
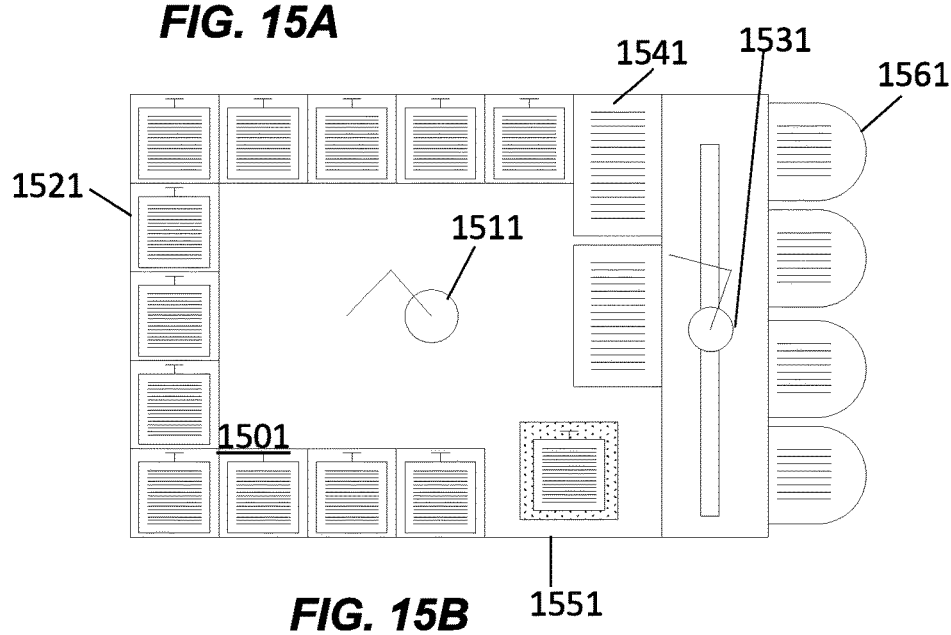
FIG. 15B depicts a top component view of a Tec-Cell stocker, in accordance with an embodiment of the present invention.

FIG. 15B depicts a top component view of a Tec-Cell stocker, in accordance with an embodiment of the present invention. Herein, a stocker system is described that includes a storage chamber 1501 which includes one or more standalone or movable containers 1521 with OHT system. In an embodiment, the stocker may include a robot 1511 for transferring the containers 1521, an EFEM robot 1531 for transferring wafers/substrates, one or plurality of opener stations 1541 and exterior containers such as FOUPs 1561.

Figure 15C:
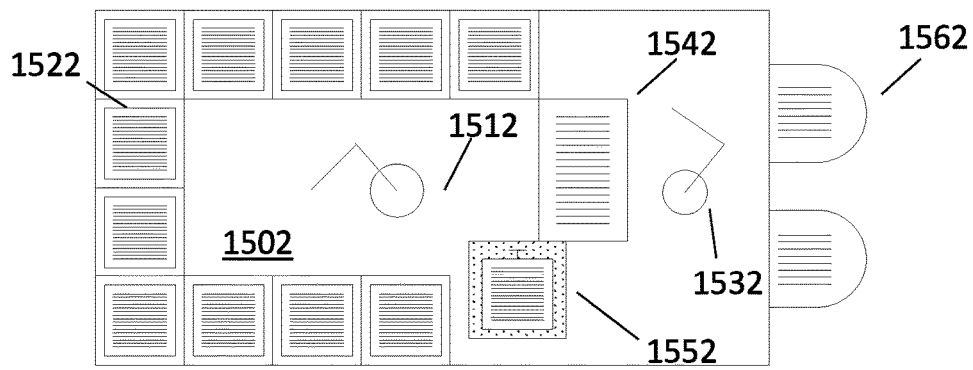
FIG. 15C depicts a top component view of a Tec-Cell stocker, in accordance with an embodiment of the present invention.

FIG. 15C depicts a top component view of a Tec-Cell stocker, in accordance with an embodiment of the present invention. Herein, a stocker system is described that includes a storage chamber 1502 which includes one or more standalone containers 1522, with or without compartment doors, for storing one or more substrates, with a combination of low density and high density loader stations. In an embodiment, the stocker may include a first robot 1512 for transferring containers, a second robot 1532 for transferring substrates, an opener station 1542, and one or more exterior containers such as FOUPs 1562.

Figure 16:
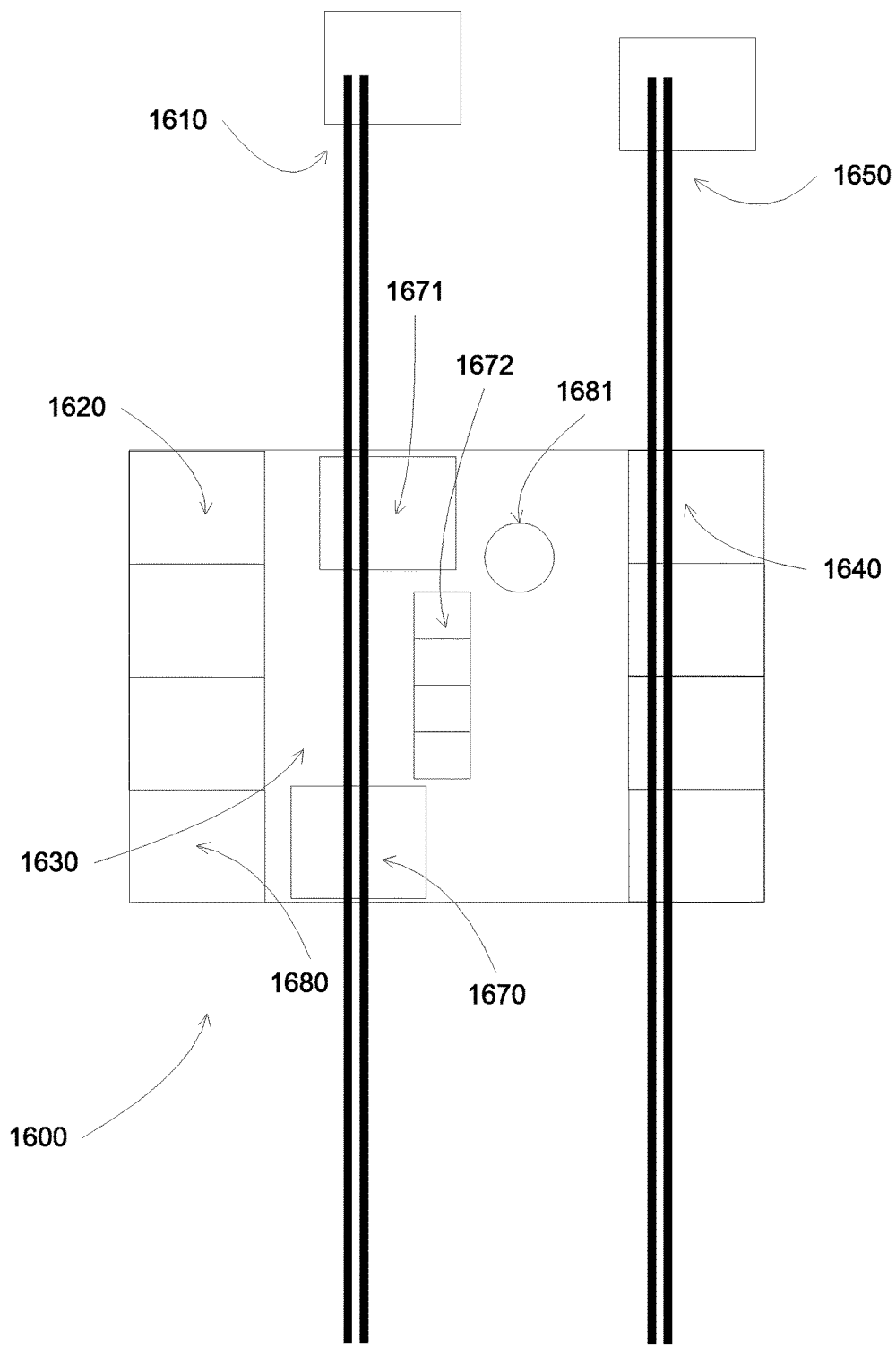
FIG. 16 depicts a top component view of Tec-Cell stocker overhead transfer (OHT), in accordance with an embodiment of the present invention.

FIG. 16 depicts a top component view of a Tec-Cell stocker system 1600, an embodiment of the present invention. Herein, an OHT system 1610 is described for one or more Tec-Cell modules 1620 stored in a storage chamber 1630. In an embodiment, a Tec-cell module 1620 may be a movable container configured for storing a stack of substrates in a collapsed state. The OHT system 1610 may be configured for performing handover of the one or more Tec-cell modules 1620 from top to down direction. Further, the Tec-cell modules and their contents such as substrates may be moved or manipulated by a robot, for example, a robot may be connected to a buffer station, or an opener station for transferring wafers to and from another container such as FOUPs 1640. In an embodiment, the FOUPs may also use an OHT system 1650.

It is also noted there may be within the system, such as within the storage area, area or compartments, which may or may not be isolated, wherein gas or mechanicals may be stored, routed, reservoir or otherwise may provide an area for systems. There also may be auxiliary robots to transfer to or from OHT such as robot 1681, as well as the robots in opener stations such as opener station 1671, as well as dedicated OHT transfer stations such as 1670. There also may be buffer stations within the system wherein containers, substrates, carriers, etc. may be held within the system for machine backlog, transfer backlog or for any reason. It is noted especially that any features may be shared across any embodiments.

Figure 17A:
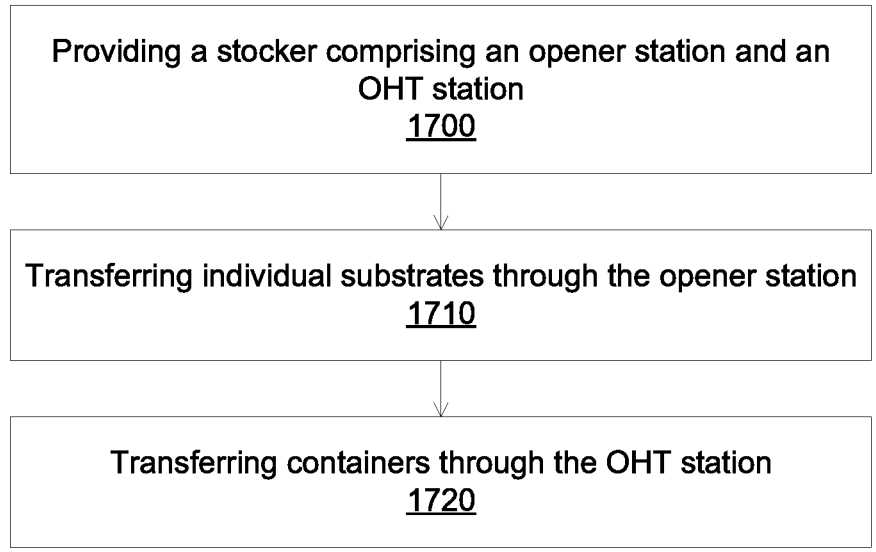
FIG. 17A describes a flow chart of a method for transferring substrates, in accordance with an embodiment of the present invention.

FIG. 17A describes a flow chart of a method for transferring substrates in a Tec-cell stocker system, in accordance with an embodiment of the present invention. Herein, step 1700 includes providing a stocker that comprises an opener station and an OHT station. Step 1710 includes transferring individual substrates through the opener station, and step 1720 includes transferring movable containers through the OHT station. In an embodiment, first a movable container is transferred to an opener station through the OHT station, then the substrates of the movable container are opened at the opener station, and thereafter, the individual substrates are transferred between the opener station and a load port. It may be noted, that the load port may be airtight, provide for all standard connections, such that the transfer is done in a sterile environment with limited or no contaminations.

Figure 17B:
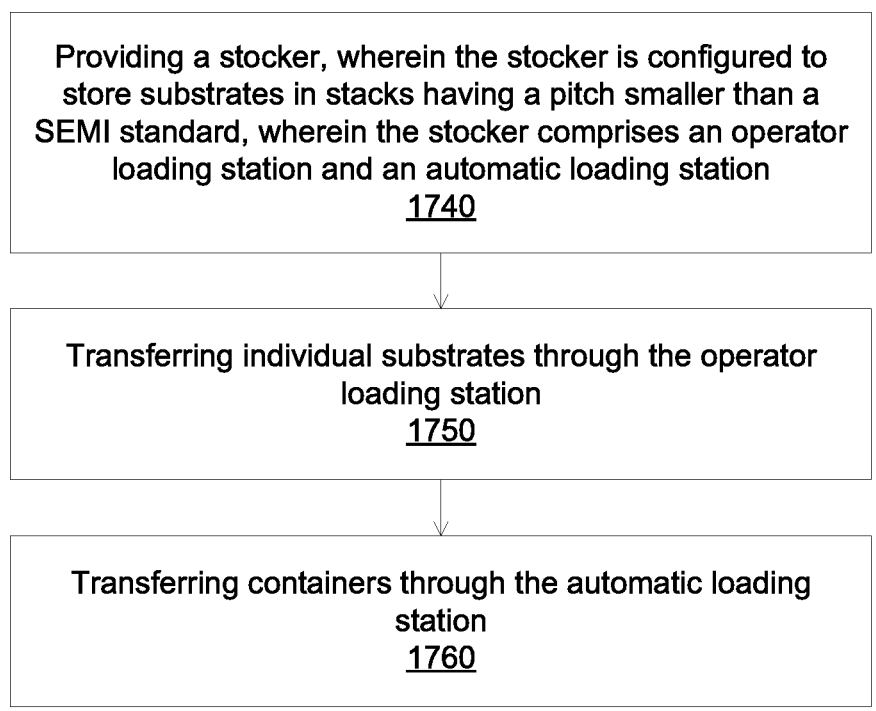
FIG. 17B describes a flow chart of a method for transferring substrates, in accordance with an embodiment of the present invention.

FIG. 17B describes a flow chart of a method for transferring substrates in a Tec-cell stocker system, in accordance with an embodiment of the present invention. Herein, step 1740 includes providing a stocker, wherein the stocker is configured to store substrates in stacks having a pitch smaller than a SEMI standard, and wherein the stocker comprises an operator loading station and an automatic loading station. The operator loading station is a port/terminal which is accessible by human manual entry. The operator loading station is a port which can be accessed by a machine transfer mechanism. Step 1750 includes transferring individual substrates through the operator loading station, and step 1760 includes transferring containers through the automatic loading station. It is noted this may be done partially as aforementioned.

Figure 18A:
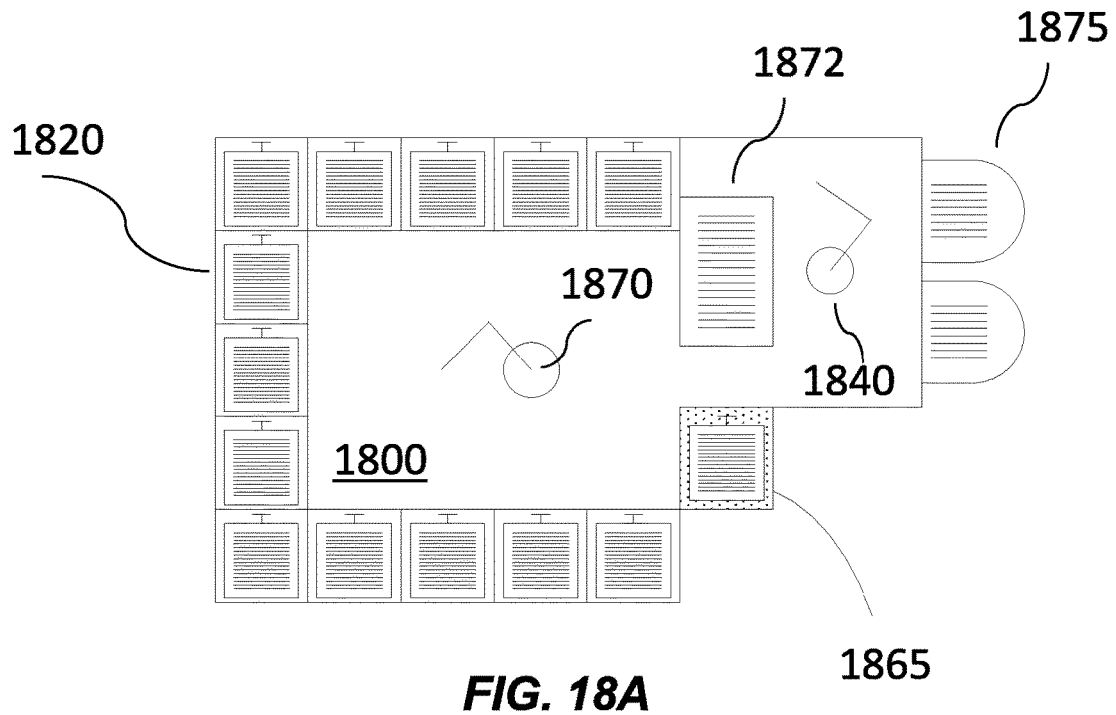
FIG. 18A depicts a top component view of Tec-Cell transfer, in accordance with an embodiment of the present invention.

FIG. 18A depicts a top component view of Tec-Cell transfer in a Tec-cell stocker, in an embodiment of the present invention. Herein, a stocker is described that includes a storage chamber 1800 which includes one or more movable containers 1820 (with OHT) for storing one or more substrates, with a combination of low density and high density loader stations. In an embodiment, the stocker includes a stand-alone load port for single substrate transfer from an opener station 1872 to one or more FOUPs 1875. In another embodiment, an operator may access a container load port 1865 for container transfer, wherein a storage robot 1870 can pick up a container to be transferred to the storage chamber 1800. It may be noted that the load port 1865 may either be manually or automatically accessed, for accessing buffer or other system providing wafers, Tec-Cell's or other materials.

Figure 18B:
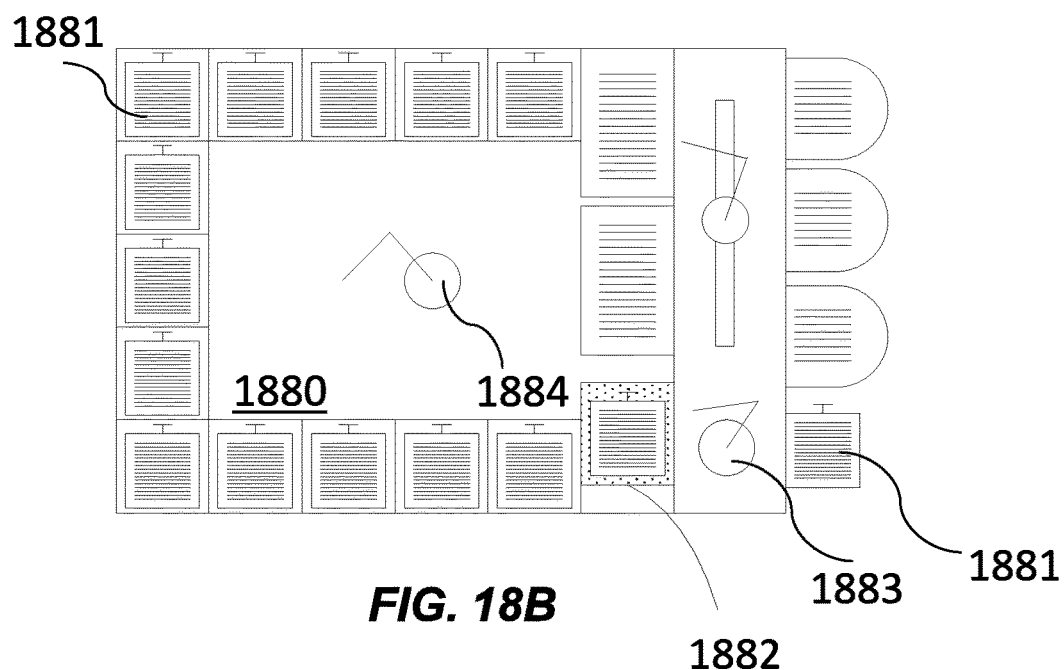
FIG. 18B depicts a top component view of Tec-Cell transfer, in accordance with an embodiment of the present invention.

FIG. 18B depicts a top component view of Tec-Cell transfer in a Tec-cell stocker, in an embodiment of the present invention. The Tec-cell stocker includes a storage chamber 1880 that includes one or more movable containers 1881 (with OHT) of closed substrates. Herein, an EFEM load port 1882 is described for individual substrate transfer as well as container transfer. In an embodiment, an EFEM robot 1883 can transfer a container 1881 to the container load port 1882, wherein a storage robot 1884 can pick up the container from the container load port 1882, to be transferred to the storage area 1880 or any other area of the chamber.

Figure 19A:
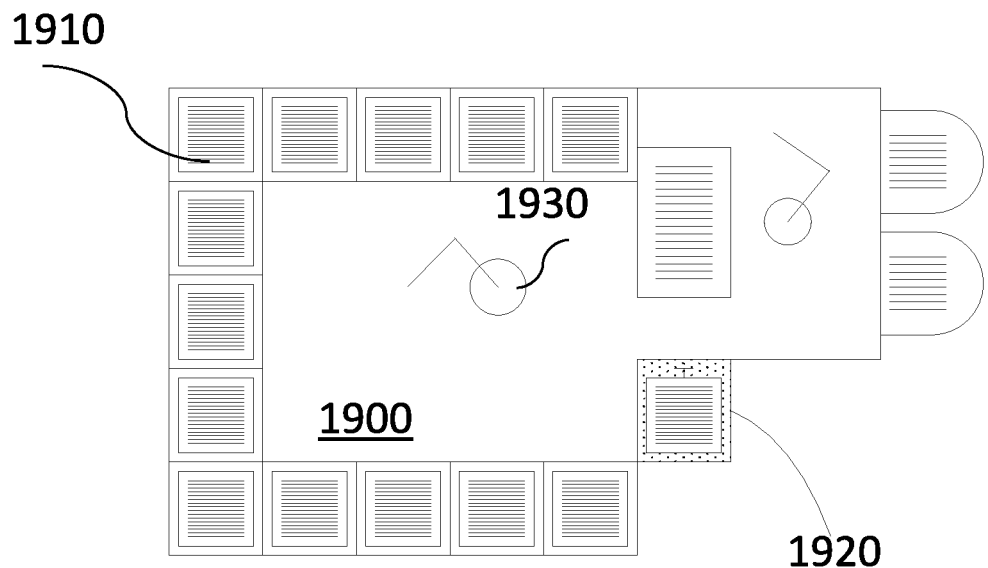
FIG. 19A depicts a top component view of Tec-Cell transfer with robot, in accordance with an embodiment of the present invention.

FIG. 19A depicts a top component view of a Tec-Cell transfer in a Tec-Cell stocker, in an embodiment of the present invention. The Tec-cell stocker includes a storage chamber 1900 with one or more containers 1910, a combination of low density and high density loader stations, a bare stack (with or without compartment/door), and a standalone load port 1920. It is noted that an operator or other mechanism may access the container load port 1910 for accepting a container. In an embodiment, in the container load port 1920, the container can be opened, and a storage robot 1930 can pick up the whole stack to be transferred to the storage chamber 1900

Figure 19B:
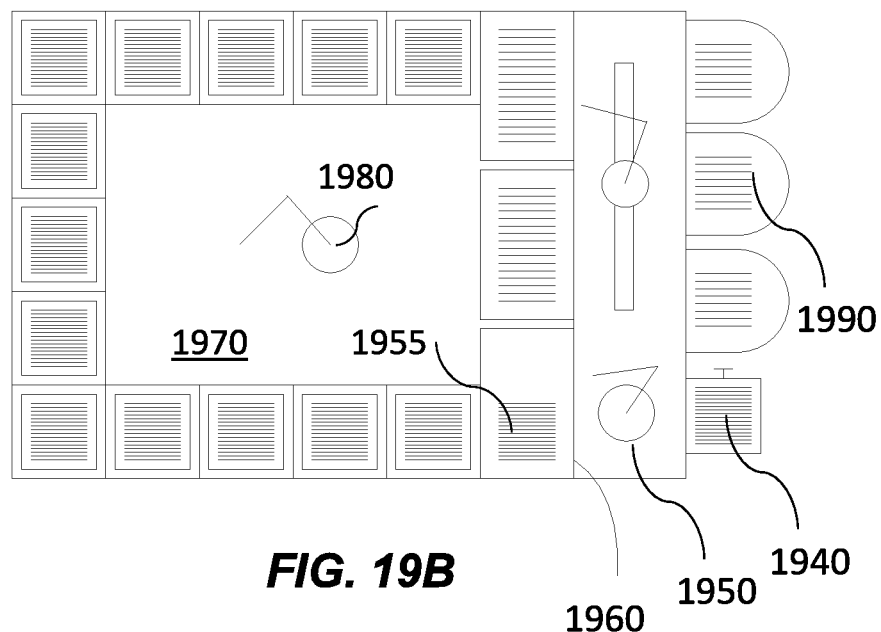
FIG. 19B depicts a top component view of Tec-Cell transfer with robot, in accordance with an embodiment of the present invention.

FIG. 19B depicts a top component view of Tec-Cell transfer in a Tec-cell stocker, in an embodiment of the present invention. FIG. 19B describes an EFEM for individual substrate transfer and container transfer. In the container load port 1940, the container can be open, and an EFEM robot 1950 can pick up the whole stack 1955 to be transferred to an opener station 1960. In an embodiment, the whole stack 1955 can be transferred to a storage chamber 1970 by a storage robot 1980. In another embodiment, upon opening of the stack 1955 of substrates at the opener station 1960, the EFEM individual robot 1950 can transfer individual substrates from the opener station 1960 to FOUPs or other containers 1990.

Figure 20:
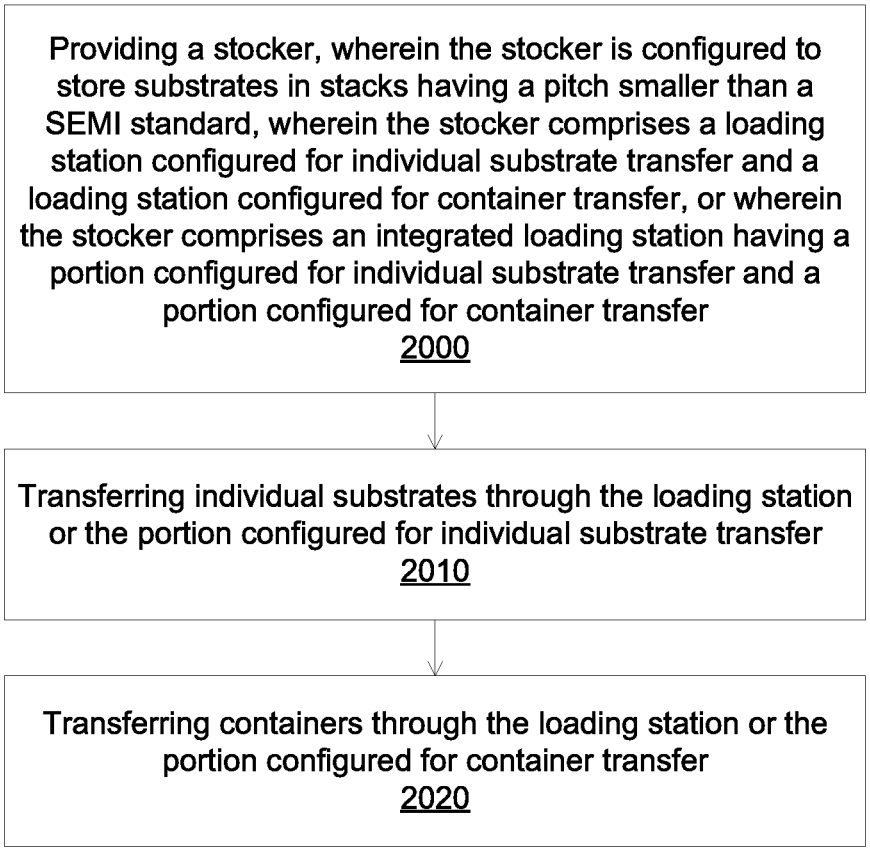
FIG. 20 describes a flow chart of a method for transferring and loading, in accordance with an embodiment of the present invention.

FIG. 20 describes a flow chart of an embodiment method for transferring and loading of stack of substrates in a Tec-cell stocker. Herein, step 2000 discloses providing a stocker, wherein the stocker is configured to store substrates in stacks having a pitch smaller than a SEMI standard, wherein the stocker comprises a loading station configured for individual substrate transfer, and a loading station configured for container transfer, and wherein the stocker comprises an integrated loading station having a portion configured for individual substrate transfer and a portion configured for container transfer. Step 2010 describes transferring individual substrates through the loading station or the portion configured for individual substrate transfer, and step 2020 discloses transferring containers through the loading station or the portion configured for container transfer. In an embodiment, the two loading stations, one with a robot for single substrate handling, and one with a robot for container handling may be replaced, or may provide auxiliary service to an OHT system as aforementioned.

FIG. 21 describes a flow chart of an embodiment method for transferring and loading with different containers. Herein, step 2100 includes forming an EFEM that comprises a loading station for a low density container and a loading station for a high density container, wherein the EFEM comprises a robot for individual substrate handling at the low density container and a robot for substrate stack handling at the high density container, and wherein the EFEM is configured to interface with one or more opener stations. Step 2110 describes transferring substrates between the opener stations and the loading stations. Step 2120 describes transferring substrates between the loading stations through an opener station.

Figure 22A:
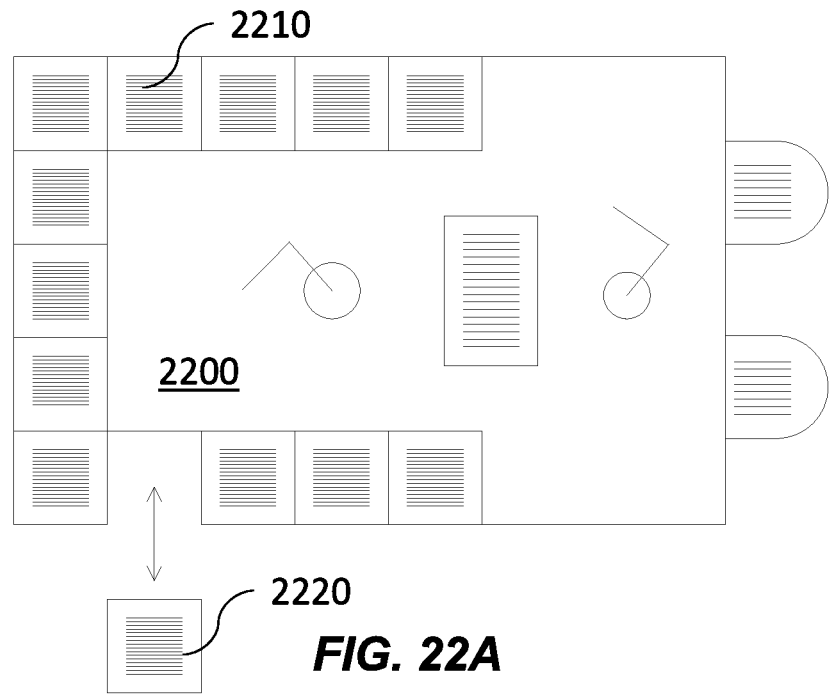
FIG. 22A depicts a top component view of Tec-Cell transfer with robot and removable components, in accordance with an embodiment of the present invention.

FIG. 22A depicts a top component view of Tec-Cell transfer with robot and removable components, in a Tec-cell stocker, in an embodiment of the present invention. Herein, a stocker is being described that has a storage chamber 2200 with removable containers 2210, wherein each container may include a stack, or at least one bare wafer, or may be empty. A container 2220 may be removed from the chamber 2200 so as to be serviced, moved, or to be provided in another system. In an embodiment, each container 2210 may have a door so as to isolate it from outside ambient when being removed from the chamber 2200, such that the containers can be removed without contamination, and during constant use.

Figure 22B:
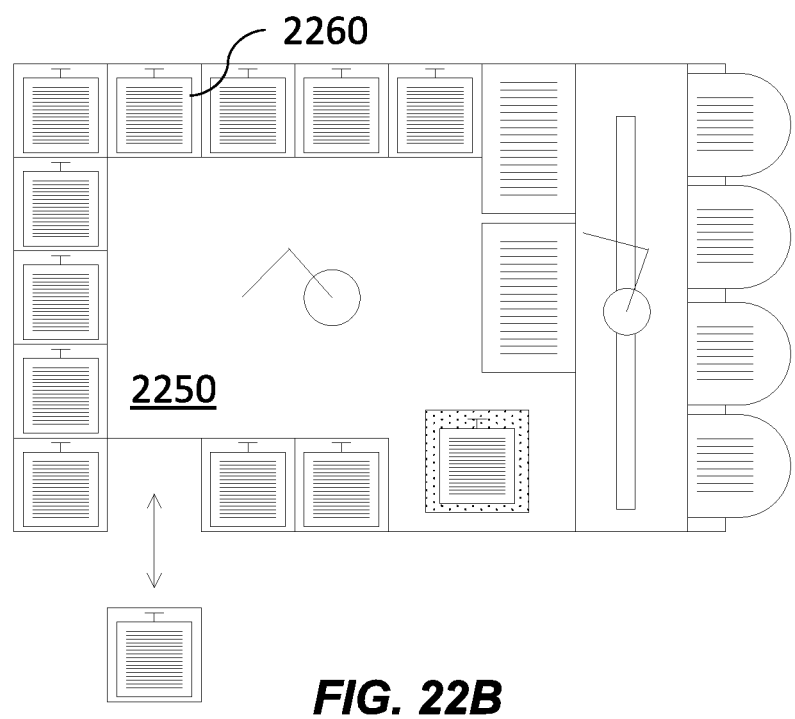
FIG. 22B depicts a top component view of Tec-Cell transfer with robot and removable components, in accordance with an embodiment of the present invention.

FIG. 22B depicts a top component view of a Tec-Cell transfer with robot and removable components, in an embodiment of the present invention. Herein, a storage chamber 2250 includes one or more containers 2260 with OHT.

FIG. 23A depicts a top component view of Tec-Cell transfer with a dock cart, in accordance with an embodiment of the present invention. FIG. 23A describes a Stocker system 2300 with a dock cart 2310 mating-configuration. The compartments 2320 may include bare stockers or may include containers carrying wafers. The compartment 2320 may be able to mate or be removed by a dock cart 2310 for mating with stocker. A high density storage Dock cart 2310 may be coupled to a storage area of the stocker 2300 to remove the compartments 2320, such as with a robot 2340 on the dock cart 2310, or via positioning of the cart. In addition, the cart can switch out compartments or containers (2320, 2350), and in any combination, such as adding a single wafer, or wafers to compartments or containers within the chamber. This may be done in any method, but may be by removing the compartment, and using the robot (2330, 2340) to add or remove a wafer, before replacing the compartment. Additionally, the robot 2330 may remove a compartment, and then put back another compartment on the dock cart 2310. The dock cart 2310 may be coupled to the storage area of the stocker, for example, coupled to any side, instead of being at the front.

FIG. 23B depicts a top component view of Tec-Cell transfer with dock cart, in accordance with an embodiment of the present invention. In an embodiment, the robot 2341 in the dock cart 2311 can bring containers 2350 to dock station, then the robot 2331 in the storage area 2301 can move the container in the dock station to a storage shelf.

FIG. 24A describes a flow chart of a method for transferring and loading with dock cart, in accordance with an embodiment of the present invention. Step 2400 describes forming a storage area with removable storage compartments, wherein the storage area is configured to store substrates at a high density.

FIG. 24B describes a flow chart of a method for transferring and loading with dock cart, in accordance with an embodiment of the present invention. Step 2420 describes forming a storage area with a docking station for accepting substrates, wherein the storage area is configured to store substrates at a high density.

FIG. 24C describes a flow chart of a method for transferring and loading with dock cart, in accordance with an embodiment of the present invention. Step 2440 describes forming a dock cart for mating with a storage area, wherein the storage area is configured to store substrates at a high density.

FIG. 24D describes a flow chart of a method for transferring and loading with dock cart, in accordance with an embodiment of the present invention. Step 2460 describes mating a dock cart to a storage area of a stocker and step 2470 describes transferring substrates from the dock cart to the storage area.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments may be within the scope of the following claims.

It may be appreciated that the various systems, methods, and apparatus disclosed herein may be embodied in a machine-readable medium and/or a machine accessible medium compatible with a data processing system (e.g., a computer system) and of which may be in any form including transitory, non-transitory or persistent data systems, as well as may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A substrate stocker system comprising:
a high density storage chamber that comprises one or more high density containers or stacks of one or more substrates, each of the one or more substrates being supported on a respective carrier wherein the one or more high density containers or stacks are in a closed position;
one or more low density containers, each of the one or more low density containers being configured to store one or more substrates;
one or more opener stations, each of the one or more opener stations configured to send or receive one or more stacks or containers from the high density storage chamber and one or more substrates from the one or more low density containers, each of the one or more opener stations comprising one or more separator modules for changing one or more distances between corresponding one or more adjacent substrates in the one or more high density containers or stacks;
a load port; and
at least one robot configured to move:
one or more containers or stacks between the high density storage chamber and the one or more opener stations; and
one or more substrates between the one or more high density containers or stacks and the one or more low density containers;
wherein
the one or more opener stations are located between the load port and the high density storage chamber;
wherein
a separator module included within the one or more opener stations comprises:
a conveyor belt; and
a motor driven cogwheel; wherein
the conveyor belt comprises a plurality of interlocking nubs which interlock into corresponding notches in individual carriers; and
the conveyor belt is driven such that the plurality of interlocking nubs interlock with the carrier and move or separate the one or more carriers and substrates by one or more predefined distances.

2. The substrate stocker system as claimed in claim 1, wherein one or more distances between one or more adjacent substrates of the one or more high density containers or stacks in the closed position, is less than a threshold distance defined by Semiconductor Equipment and Materials International (SEMI) standard.

3. The substrate stocker system as claimed in claim 1, wherein the one or more high density containers or stacks of the one or more substrates in the closed position, are disposed within the high density storage chamber, in at least one of: a container with removable top and bottom plates, a movable high density container having a body and a door, a movable high density container having one or more shelves, a side door, and a bottom door, and a movable high density container being provided with an Overhead Transfer Vehicle (OHT).

4. The substrate stocker system as claimed in claim 3, wherein
the load port includes a container load port configured to receive and store the one or more movable high density containers or stacks with the OHT; and
the at least one robot includes a robot configured to transfer the one or more movable high density containers or stacks with the OHT, from the container load port to the high density storage chamber.

5. The substrate stocker system as claimed in claim 1, further comprising an Equipment Front End Module (EFEM) coupled to the one or more opener stations, wherein a robot is disposed within the EFEM module for moving one or more substrates between the one or more opener stations and the one or more low density containers.

6. The substrate stocker system as claimed in claim 1, further comprising:
an operator loading station configured to enable transfer of one or more individual substrates and carriers to and from the one or more opener stations; and
an automatic loading station configured to enable automatic transfer of one or more containers to and from the high density storage chamber.

7. The substrate stocker system as claimed in claim 1, wherein the one or more opener stations are provided with a separator module that includes an actuator with one or more extrusions, wherein the one or more extrusions match an individual corresponding carrier and substrate such that the one or more extrusions hold the individual carrier and substrate and wherein when the actuator is enabled, the one or more extrusions separate the one or more carriers and substrates by one or more predefined distances.

8. The substrate stocker system as claimed in claim 1, further comprising an external dock cart that comprises:
one or more robots for moving one or more containers and one or more carriers and substrates from or to the external dock cart, wherein the high density storage chamber includes a docking station for mating with the external dock cart, and wherein the one or more robots is configured to transfer at least one of containers and substrates between the docking station and the dock cart.

* * * * *